United States Patent
Zhen et al.

(10) Patent No.: US 12,313,680 B2
(45) Date of Patent: May 27, 2025

(54) AUTOMATIC TEST PATTERN GENERATION-BASED CIRCUIT VERIFICATION METHOD AND APPARATUS

(71) Applicant: Huawei Technologies Co., Ltd., Shenzhen (CN)

(72) Inventors: Huiling Zhen, Hong Kong (CN); Miaohui Chen, Shenzhen (CN); Mingxuan Yuan, Hong Kong (CN); Naixing Wang, Shenzhen (CN); Wanqian Luo, Chengdu (CN); Yu Huang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/397,481

(22) Filed: Dec. 27, 2023

(65) Prior Publication Data
US 2024/0125850 A1  Apr. 18, 2024

Related U.S. Application Data

(63) Continuation of application No. PCT/CN2021/102673, filed on Jun. 28, 2021.

(51) Int. Cl.
*G01R 31/3181* (2006.01)
*G01R 31/317* (2006.01)
(Continued)

(52) U.S. Cl.
CPC . *G01R 31/31813* (2013.01); *G01R 31/31707* (2013.01); *G01R 31/3177* (2013.01);
(Continued)

(58) Field of Classification Search
CPC ........ G01R 31/31813; G01R 31/31707; G01R 31/3177; G01R 31/318342;
(Continued)

(56) References Cited

U.S. PATENT DOCUMENTS 7,356,747 B2    4/2008    Hsiao et al.
8,584,073 B2    11/2013   Kapur et al.
(Continued)

OTHER PUBLICATIONS

Drechsler, et al., On Acceleration of SAT-Based ATPG for Industrial Designs, Jul. 2008, IEEE, vol. 27, No. 7, pp. 1329-1333. (Year: 2008).*

*Primary Examiner* — John J Tabone, Jr.
(74) *Attorney, Agent, or Firm* — Conley Rose, P.C.

(57) ABSTRACT

An automatic test pattern generation-based circuit verification method, comprises determining a to-be-detected first logic cone from a fan-out logic cone corresponding to the target line; determining, based on the first logic cone, a to-be-detected second logic cone from a fan-in logic cone corresponding to the target line; generating a first conjunctive normal form (CNF) based on the first logic cone and the second logic cone, and detecting the target line by using the first CNF to obtain a first detection result; and if the first logic cone is a partial region in the fan-out logic cone, and the first detection result meets a first specified condition corresponding to the first logic cone, determining a first verification result of the target line based on the first detection result.

20 Claims, 13 Drawing Sheets

(51) Int. Cl.
  *G01R 31/3177* (2006.01)
  *G01R 31/3183* (2006.01)
  *G01R 31/3185* (2006.01)
  *G06F 30/33* (2020.01)
  *G06F 30/3323* (2020.01)

(52) U.S. Cl.
  CPC ............ *G01R 31/318342* (2013.01); *G01R 31/31835* (2013.01); *G01R 31/318502* (2013.01); *G01R 31/318544* (2013.01); *G06F 30/33* (2020.01); *G06F 30/3323* (2020.01)

(58) Field of Classification Search
  CPC ...... G01R 31/31835; G01R 31/318502; G01R 31/318544; G06F 30/33; G06F 30/3323
  USPC ................. 714/738, 735, 724, 742
  See application file for complete search history.

(56) References Cited

U.S. PATENT DOCUMENTS

| | | | |
|---|---|---|---|
| 8,661,304 B2 | 2/2014 | Guo et al. | |
| 8,689,069 B2 | 4/2014 | Krenz-Baath et al. | |
| 11,797,736 B2* | 10/2023 | Bhunia | G06F 30/327 |
| 2004/0030974 A1* | 2/2004 | Ashar | G01R 31/31835 |
| | | | 714/724 |
| 2004/0230407 A1 | 11/2004 | Gupta et al. | |
| 2012/0198399 A1* | 8/2012 | Safarpour | G06F 30/3323 |
| | | | 716/106 |
| 2013/0268906 A1* | 10/2013 | Arbel | G06F 30/3323 |
| | | | 716/107 |
| 2019/0340394 A1* | 11/2019 | Sinanoglu | G01R 31/31719 |
| 2020/0394352 A1* | 12/2020 | Amaru | G06F 30/31 |
| 2024/0125850 A1* | 4/2024 | Zhen | G01R 31/318544 |

* cited by examiner

AUTOMATIC TEST PATTERN GENERATION-BASED CIRCUIT VERIFICATION METHOD AND APPARATUS

CROSS-REFERENCE TO RELATED APPLICATIONS

This is a continuation of International Patent Application No. PCT/CN2021/102673 filed on Jun. 28, 2021, the disclosure of which is hereby incorporated by reference in its entirety.

TECHNICAL FIELD

This disclosure relates to the field of chip verification, and in particular, to an automatic test pattern generation-based circuit verification method and an apparatus.

BACKGROUND

With rapid development of semiconductor technologies, a larger integrated circuit can be integrated on a smaller component, and enhancement of chip manufacturing capabilities provides more possibilities for development of smart devices.

Currently, a mainstream central processing unit (CPU) has reached a process of 7 nm to 14 nm, and even 4 nm or less has reached in a research and development process. A more advanced manufacturing process can integrate more transistors inside a CPU and a graphics processing unit (GPU), so that a processor has more functions and higher performance. In addition, a more advanced manufacturing process can further reduce a core size of the processor. That is, more CPUs and GPUs can be manufactured on wafers of a same size. New materials and processes improve product performance, making more complex electronic devices possible. However, features such as being more difficult to control and accompanying larger integrated circuits make chip testing more difficult. Consequently, production yields are reduced and manufacturing costs are increased.

After a chip circuit is designed, the chip circuit needs to be verified to check a defect of the chip circuit. An automatic test pattern generation (ATPG) technology is one of the important technologies to discover a defect of a circuit and increase yields by generating a test pattern. In an experiment, the test pattern is used as a hypothetical input of a circuit under test (CUT). If an obtained output value does not meet an expectation, it is considered that a fault or a defect is found.

A conventional ATPG testing method is a detecting method according to a satisfiability (SAT) algorithm. When SAT-based ATPG testing is performed, each line of the circuit under test needs to be detected, and any line is a connection line between two connected gate circuits in the circuit under test. A conjunctive normal form (CNF) is generated for each line and the CNF is solved. The CNF corresponding to each line is generated based on a circuit structure and a circuit propagation characteristic. After the CNF is generated, the CNF is input into an SAT solver for solution. The SAT solver is a black-box solver. After the CNF is input, a detection result output by the SAT solver can be directly obtained. Specifically, a detection result of each line includes two types of faults: a difficult-to-detect fault and a detectable fault. The difficult-to-detect fault indicates that the same output value is obtained regardless of which input value is given to the circuit under test. In this case, whether a to-be-detected line is a redundant line needs to be determined. The detectable fault is a circuit fault indicating that a fault can be determined based on an output value of the circuit under test within a specified time when an input value of the circuit under test is assumed. When a result of SAT solution is the detectable fault, the SAT solver may further output a test pattern, and the test pattern may be used to detect a circuit fault.

As complexity of the circuit structure of the circuit under test increases, a time for generating the CNF becomes longer. For example, for a circuit under test with tens of thousands of gate circuits, during serial calculation, a time for generating the CNF is far greater than a time for solving the CNF. This increases a verification time of the chip circuit and reduces verification efficiency of the chip circuit.

SUMMARY

This disclosure provides an automatic test pattern generation-based circuit verification method and an apparatus, to improve detection efficiency of a chip circuit.

According to a first aspect, an embodiment of this disclosure provides an automatic test pattern generation-based circuit verification method. The method includes performing the following procedures on a target line in a circuit under test, where the circuit under test includes a plurality of lines, any line is a connection line between two connected gate circuits, and the target line is any line in the plurality of lines; determining a to-be-detected first logic cone from a fan-out logic cone corresponding to the target line, where the fan-out logic cone is a region formed by a gate circuit that passes from the target line to an output end of the circuit under test; determining, based on the first logic cone, a to-be-detected second logic cone from a fan-in logic cone corresponding to the target line, where the fan-in logic cone is a region formed by a gate circuit that passes from an input end of the circuit under test to the target line, and the second logic cone is a region that is in the fan-in logic cone and that is formed by a gate circuit that affects an output value of the first logic cone; generating a first conjunctive normal form CNF based on the first logic cone and the second logic cone, and detecting the target line by using the first CNF to obtain a first detection result, where the first detection result indicates a fault type of the target line; and if the first logic cone is a partial region in the fan-out logic cone, and the first detection result meets a first specified condition corresponding to the first logic cone, determining a first verification result of the target line based on the first detection result.

In the foregoing method, the to-be-detected first logic cone is determined from the fan-out logic cone corresponding to the target line in the circuit under test, the second logic cone is determined from the fan-in logic cone, and the first CNF is generated based on the first logic cone and the second logic cone. To be specific, in the ATPG-based circuit verification method provided in this embodiment of this disclosure, the CNF is not directly generated based on all fan-out logic cones and all fan-in logic cones. This reduces complexity of generating the CNF, and further shortens a time for generating the CNF. The target line is detected by using the first CNF, to obtain the first detection result. If the first logic cone is the partial region in the fan-out logic cone, and the first detection result meets the first specified condition corresponding to the first logic cone, the first verification result of the target line is determined based on the first detection result. According to the method, the first verification result of the target line may be generated based on the first detection result corresponding to a part of logic cones.

In this way, accuracy of the verification result is ensured, and a calculation amount is reduced, thereby improving verification efficiency.

In a possible design, the method further includes: if the first logic cone is an entire region in the fan-out logic cone, determining the first verification result based on the first detection result.

In a possible design, the method further includes: if the first logic cone is the partial region in the fan-out logic cone, and the first detection result does not meet the first specified condition, determining a to-be-detected first logic cone again from the fan-out logic cone, where first logic cones determined different times are not all the same.

According to this design, when the first detection result does not meet the first specified condition, a first logic cone may be determined again until the first detection result meets the first specified condition. The first logic cone and the first detection result corresponding to the first logic cone are successively determined, to implement a method for incrementally dividing the first logic cone and performing detection. In this way, the calculation amount is reduced, the time for generating the CNF is reduced, and the efficiency is improved.

In a possible design, the determining a to-be-detected first logic cone from a fan-out logic cone corresponding to a target line includes determining, based on a preset initial depth value and a first step value, the first logic cone from the fan-out logic cone, where the initial depth value represents a distance between the target line and the gate circuit.

In a possible design, the first specified condition is that the fault type in the first detection result is a difficult-to-detect fault.

According to the foregoing design, the first logic cone may be divided from the fan-out logic cone based on a depth. Because CNF solution is an SAT problem, when the first detection result corresponding to the CNF generated based on the first logic cone and the corresponding second logic cone is a difficult-to-detect fault, it indicates that there is no set of solutions that can make a proposition of "assuming that the target line is faulty" true. In this case, it may be determined that the first verification result corresponding to the target line is the difficult-to-detect fault. It can be learned that according to the ATPG-based method provided in this disclosure, a verification result of the target line can be obtained without performing solution on entire regions of the fan-out logic cone and the fan-in logic cone. This improves verification efficiency.

In a possible design, the determining a to-be-detected first logic cone from a fan-out logic cone corresponding to a target line includes determining, based on a preset quantity of output ends and a second step value, the first logic cone from the fan-out logic cone.

In a possible design, the first detection result includes the fault type and a test pattern, and the test pattern is used to perform circuit fault detection on the circuit under test; and the first specified condition is that the fault type in the first detection result is a detectable fault.

According to the foregoing design, the first logic cone may be determined from the fan-out logic cone based on the quantity of output ends. Because CNF solution is an SAT problem, when the first detection result corresponding to the CNF generated based on the first logic cone and the corresponding second logic cone is a detectable fault, it indicates that there is a set of solutions that can make a proposition of "assuming that the target line is faulty" true. In this case, another part of the fan-out logic cone other than the first logic cone does not need to be verified, the fault type of the target line can be determined as the detectable fault, and the test pattern can be determined, to realize efficient verification of the fault of the target line.

In a possible design, the method further includes determining a to-be-detected third logic cone from the fan-out logic cone; and determining a to-be-detected fourth logic cone from the fan-in logic cone, where the third logic cone is different from the first logic cone, and the fourth logic cone is a region that is in the fan-in logic cone and that is formed by a gate circuit that affects an output value of the third logic cone; generating a second CNF based on the third logic cone and the fourth logic cone, and detecting the target line by using the second CNF to obtain a second detection result, where the second detection result indicates the fault type of the target line; when the first verification result is not determined, if the third logic cone is a partial region in the fan-out logic cone, and the second detection result meets a second specified condition corresponding to the third logic cone, determining, based on the second detection result, a second verification result corresponding to the target line, and stopping detecting the target line by using the first CNF; and when the first verification result is determined, stopping detecting the target line by using the second CNF.

According to the design, the target line may be detected in two manners during implementation. For example, the first logic cone may be divided based on a depth, and the third logic cone may be divided based on a quantity of output ends. Alternatively, the first logic cone may be divided based on a quantity of output ends, and the third logic cone may be divided based on a depth. When the target line is detected in the two manners, after a verification result corresponding to the target line is obtained in one manner, a detection thread in the other manner may be stopped. This further improves efficiency of performing ATPG detection on the target line.

In a possible design, the first CNF includes at least one clause, and the at least one clause is generated based on a gate circuit in the first logic cone and a gate circuit in the second logic cone.

In a possible design, the detecting the target line by using the first CNF includes if a quantity of clauses included in the first CNF is greater than or equal to a specified threshold, separately performing satisfiability SAT solution on the at least one clause, and determining an SAT solution result of each clause; and using an intersection of SAT solution results of the at least one clause as the first detection result.

According to the design, if the quantity of clauses included in the first CNF is greater than or equal to the specified threshold, it indicates that the first CNF is complex. In this case, an SAT black-box solution manner is not used, but each clause included in the first CNF is separately solved. Then, a solution result of the at least one clause is used as the first detection result, to simplify a process for solving the CNF and reduce a time required for solving the CNF.

In a possible design, the first CNF includes at least one target clause corresponding to at least one target sub-circuit in the first logic cone and at least one target clause corresponding to at least one target sub-circuit in the second logic cone, where the target sub-circuit is in a one-to-one correspondence with the target clause, and any target sub-circuit includes at least one gate circuit.

In a possible design, before the to-be-detected first logic cone is determined from the fan-out logic cone corresponding to the target line, the method further includes if a quantity of gate circuits included in the fan-in logic cone and the fan-out logic cone is greater than a first specified threshold, determining a target sub-circuit in the fan-in logic cone based on the gate circuit in the fan-in logic cone, and determining a target sub-circuit in the fan-out logic cone based on the gate circuit in the fan-out logic cone.

In a possible design, the target sub-circuit is a fan-out free region (FFR).

According to the foregoing design, when the quantity of gate circuits included in the fan-in logic cone and the fan-out logic cone is greater than the first specified threshold, the FFR in the circuit under test may be identified to decompose the circuit under test. This simplifies a result of the circuit under test, facilitates generation of the first CNF, and ensures efficient detection on a larger circuit.

In a possible design, before the to-be-detected first logic cone is determined from the fan-out logic cone corresponding to the target line, the method further includes if a quantity of gate circuits included in the fan-in logic cone and the fan-out logic cone is greater than a second specified threshold, simplifying two equivalent gate circuits in the fan-in logic cone and the fan-out logic cone into one gate circuit for generating a CNF clause, where the second specified threshold is less than the first specified threshold, and the two equivalent gate circuits are two gate circuits with the same input and the same output.

According to the foregoing design, equivalent gate circuits in the circuit corresponding to the fan-in logic cone and the fan-out logic cone may be simplified, to reduce a quantity of gate circuits that need to be considered when the first CNF is generated. This reduces difficulty in generating the first CNF and improves circuit verification efficiency.

According to a second aspect, an embodiment of this disclosure provides an automatic test pattern generation apparatus, including a generation unit and a detection unit.

The generation unit is configured to perform the following procedures on a target line in a circuit under test, where the circuit under test includes a plurality of lines, any line is a connection line between two connected gate circuits, and the target line is any line in the plurality of lines; determine a to-be-detected first logic cone from a fan-out logic cone corresponding to a target line, where the fan-out logic cone is a region formed by a gate circuit that passes from the target line to an output end of the circuit under test; determine, based on the first logic cone, a to-be-detected second logic cone from a fan-in logic cone corresponding to the target line, where the fan-in logic cone is a region formed by a gate circuit that passes from an input end of the circuit under test to the target line, and the second logic cone is a region that is in the fan-in logic cone and that is formed by a gate circuit that affects an output value of the first logic cone; and generate a first conjunctive normal form CNF based on the first logic cone and the second logic cone.

The detection unit is configured to detect the target line by using the first CNF to obtain a first detection result, where the first detection result indicates a fault type of the target line; and if the first logic cone is a partial region in the fan-out logic cone, and the first detection result meets a first specified condition corresponding to the first logic cone, determine a first verification result of the target line based on the first detection result.

In a possible design, the detection unit is further configured to, if the first logic cone is an entire region of the fan-out logic cone, determine the first verification result based on the first detection result.

In a possible design, the generation unit is further configured to, if the first logic cone is the partial region in the fan-out logic cone, and the first detection result does not meet the first specified condition, determine a to-be-detected first logic cone again from the fan-out logic cone, where first logic cones determined different times are not all the same.

In a possible design, the generation unit is specifically configured to determine, based on a preset initial depth value and a first step value, the first logic cone from the fan-out logic cone, where the initial depth value represents a distance between the target line and the gate circuit.

In a possible design, the first specified condition is that the fault type in the first detection result is a difficult-to-detect fault.

In a possible design, the generation unit is specifically configured to determine, based on a preset quantity of output ends and a second step value, the first logic cone from the fan-out logic cone.

In a possible design, the first detection result includes the fault type and a test pattern, and the test pattern is used to perform circuit fault detection on the circuit under test; and the first specified condition is that the fault type in the first detection result is a detectable fault.

In a possible design, the generation unit is further configured to determine a to-be-detected third logic cone from the fan-out logic cone; and determine a to-be-detected fourth logic cone from the fan-in logic cone, where the third logic cone is different from the first logic cone, and the fourth logic cone is a region that is in the fan-in logic cone and that is formed by a gate circuit that affects an output value of the third logic cone; and generate a second CNF based on the third logic cone and the fourth logic cone.

The detection unit is further configured to detect the target line by using the second CNF to obtain a second detection result, where the second detection result indicates the fault type of the target line; when the first verification result is not determined, if the third logic cone is a partial region in the fan-out logic cone, and the second detection result meets a second specified condition corresponding to the third logic cone, determine, based on the second detection result, a second verification result corresponding to the target line, and stop detecting the target line by using the first CNF; and when the first verification result is determined, stop detecting the target line by using the second CNF.

In a possible design, the first CNF includes at least one clause, and the at least one clause is generated based on a gate circuit in the first logic cone and a gate circuit in the second logic cone.

In a possible design, the detection unit is specifically configured to, if a quantity of clauses included in the first CNF is greater than or equal to a specified threshold, separately perform satisfiability SAT solution on the at least one clause, and determine an SAT solution result of each clause; and use an intersection of SAT solution results of the at least one clause as the first detection result.

In a possible design, the first CNF includes at least one target clause corresponding to at least one target sub-circuit in the first logic cone and at least one target clause corresponding to at least one target sub-circuit in the second logic cone, where the target sub-circuit is in a one-to-one correspondence with the target clause, and any target sub-circuit includes at least one gate circuit.

In a possible design, the automatic test pattern generation apparatus further includes a circuit decomposition unit. The circuit decomposition unit is configured to before the generation unit determines the to-be-detected first logic cone from the fan-out logic cone corresponding to the target line, if a quantity of gate circuits included in the fan-in logic cone and the fan-out logic cone is greater than a first specified threshold, determine a target sub-circuit in the fan-in logic cone based on the gate circuit in the fan-in logic cone, and determine a target sub-circuit in the fan-out logic cone based on the gate circuit in the fan-out logic cone.

In a possible design, the target sub-circuit is a FFR.

In a possible design, the automatic test pattern generation apparatus further includes a circuit simplification unit. The circuit simplification unit is configured to before the generation unit determines the to-be-detected first logic cone from the fan-out logic cone corresponding to the target line, if a quantity of gate circuits included in the fan-in logic cone and the fan-out logic cone is greater than a second specified threshold, simplify two equivalent gate circuits in the fan-in logic cone and the fan-out logic cone into one gate circuit for generating a CNF clause, where the second specified threshold is less than the first specified threshold, and the two equivalent gate circuits are two gate circuits with the same input and the same output.

According to a third aspect, an embodiment of this disclosure provides an automatic test pattern generation apparatus, including at least one processor. The at least one processor is coupled to at least one memory, and the at least one processor is configured to read a computer program stored in the at least one memory, to perform the method provided in the first aspect.

According to a fourth aspect, an embodiment of this disclosure further provides a chip. The chip is connected to a memory, and the chip is configured to read and execute a software program stored in the memory, to perform the method provided in any one of the foregoing aspects.

According to a fifth aspect, an embodiment of this disclosure further provides a chip system. The chip system includes a processor, configured to support a computer apparatus in implementing the method provided in any one of the foregoing aspects. In a possible design, the chip system further includes a memory. The memory is configured to store a program and data that are necessary for the computer apparatus. The chip system may include a chip, or may include a chip and another discrete device.

According to a sixth aspect, an embodiment of this disclosure further provides a computer program. When the computer program is run on a computer, the computer is enabled to perform the method provided in any one of the foregoing aspects.

According to a seventh aspect, an embodiment of this disclosure further provides a computer-readable storage medium. The computer-readable storage medium stores a computer program. When the computer program is executed by a computer, the computer is enabled to perform the method provided in any one of the foregoing aspects.

DESCRIPTION OF EMBODIMENTS

To facilitate understanding of embodiments of this disclosure, the following describes terms related to embodiments of this disclosure.

(1) Gate circuit: A unit circuit for implementing basic logic operations and composite logic operations is referred to as a gate circuit. Commonly used gate circuits have AND gate, OR gate, NOT gate, NAND gate, NOR gate, AND NOR gate, XOR gate and the like in terms of logic functions.

Figure 1:
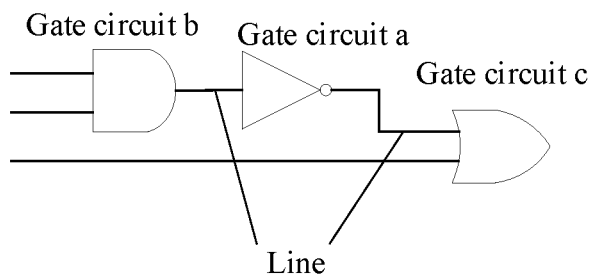
FIG. 1 is a simple schematic circuit diagram.

(2) Line: A line is a connection line between any two connected gate circuits in a circuit. For example, FIG. 1 is a simple schematic circuit diagram. A gate circuit a is connected to a gate circuit b, and a gate circuit a is also connected to a gate circuit c. In this case, a connection line between the gate circuit a and the gate circuit b and a connection line between the gate circuit a and the gate circuit c are lines mentioned in this embodiment of this application.

Figure 2:
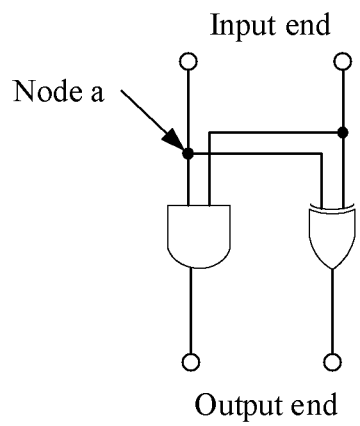
FIG. 2 is a schematic diagram of a fan-out node.

(3) Fan-out: When a node is both an output node of one gate circuit and an input node of a plurality of gate circuits, the node is referred to as a fan-out node. A node a in FIG. 2 is a fan-out node.

Figure 3:
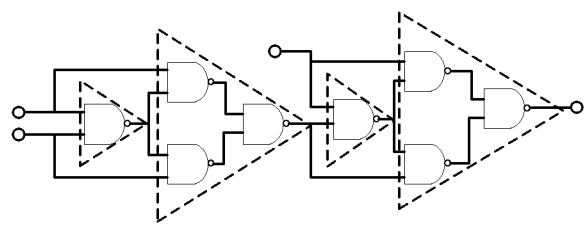
FIG. 3 is a schematic diagram of a FFR.

A FFR is a region corresponding to a sub-circuit that does not include a fan-out node. For example, in the circuit shown in FIG. 3, there is one FFR in each triangle box.

Figure 4:
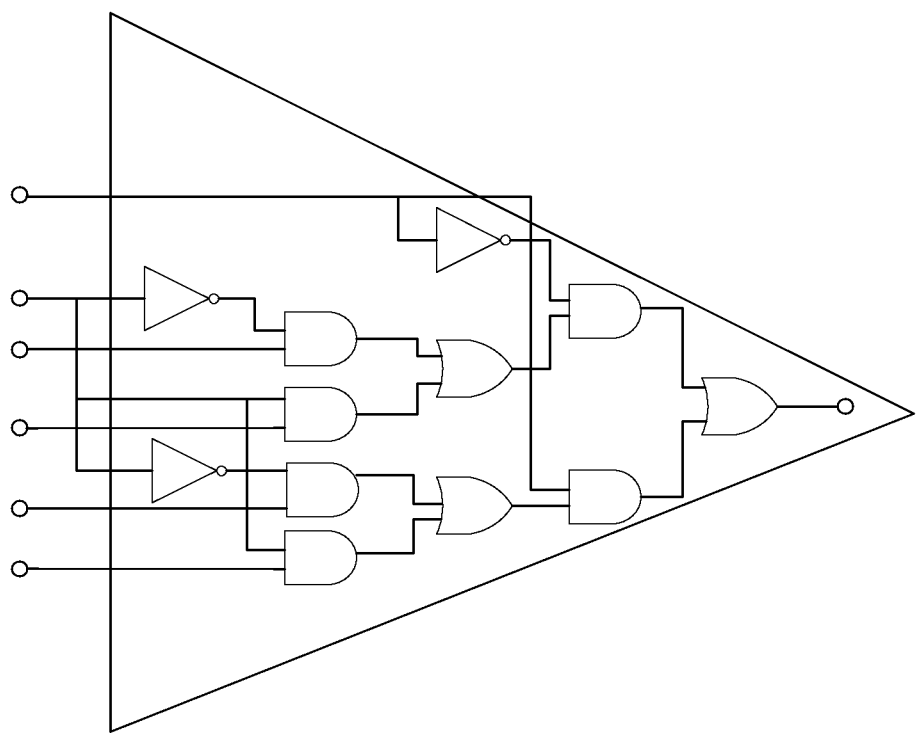
FIG. 4 is a schematic diagram of a logic cone.

(4) Logic cone: A logic cone is a cone region formed by a plurality of gate circuits. FIG. 4 is a schematic diagram of a logic cone.

Figure 5:
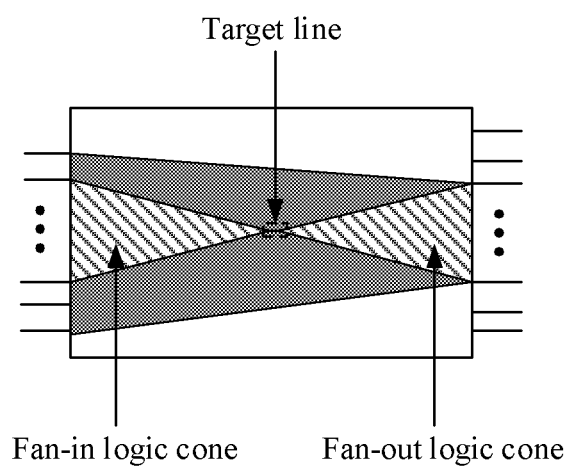
FIG. 5 is a schematic diagram of a fan-in logic cone and a fan-out logic cone.

A fan-in logic cone is a region formed by a gate circuit that passes from an input end of a circuit to a target line; and a fan-out logic cone is a region formed by a gate circuit that passes from a target line to an output end of a circuit. FIG. 5 is a schematic diagram of a fan-in logic cone and a fan-out logic cone.

Generally, when a circuit is verified, both a quantity of fan-out nodes and a depth of a logic cone affect detection difficulty of the circuit. A larger quantity of fan-out nodes and a larger depth of the logic cone indicate a longer time and a higher difficulty in circuit verification.

(5) ATPG is a program development language and may be used to detect fault types of a plurality of lines included in a circuit under test. When the circuit verification is performed based on the ATPG, the fault type of each line can be determined. For example, the fault type of each line is determined to be a detectable fault or a difficult-to-detect fault. When the fault type of the line is determined to be the detectable fault, a semiconductor device test is performed by using test patterns automatically generated by the program. The test patterns are loaded to an input end of the device in sequence, and output signals are collected and compared with pre-calculated output patterns to determine a test result, to detect the circuit fault.

(6) CNF is a normal form of propositional formulas, and is mainly used to solve logical judgment of propositional formulas. A conjunctive normal form of a proposition is not unique. The conjunctive normal form of the proposition can be obtained through a truth table or equivalent transformation. The propositional conjunctions that can be included in the CNF formula are AND, OR, and NOT.

(7) A SAT problem is a problem of determining whether there is an explanation satisfying a given proposition. In other words, the satisfiability problem asks whether variables of a given propositional formula can be consistently replaced with a value TRUE or FALSE, and when the formula is evaluated to be TRUE, the formula is said to be satisfiable. If there is no assignment that can make the proposition formula TRUE, that is, for all possible variable assignments, the result of the proposition formula is FALSE, the formula is said to be unsatisfiable.

(8) A netlist is a file used to describe a connection relationship between circuit components in a circuit design. Generally, the netlist is a text file that complies with a relatively simple markup syntax.

A chip is an integrated circuit manufactured on a surface of a semiconductor wafer and adopts a method of miniaturizing a circuit. With development of chip circuit manufacturing processes, a larger integrated circuit can be integrated on a smaller component, and enhancement of chip manufacturing capabilities provides more possibilities for development of smart devices.

After a chip circuit is designed, the chip circuit needs to be verified to check whether the chip circuit has a defect. The circuit includes a plurality of gate circuits, and some larger integrated chips may include tens of thousands of gate circuits. In a chip circuit verification process, a line between any two connected gate circuits in the circuit needs to be detected. A possible circuit fault of each line is classified into two types. One circuit fault type is a detectable fault, and the detectable fault is a circuit fault indicating that a fault can be determined based on an output value of the circuit under test within a specified time when an input value of the circuit under test is assumed. Another circuit fault type is a difficult-to-detect fault. The difficult-to-detect fault indicates that the same output value is obtained regardless of which input value is given to a circuit under test. In this case, whether a to-be-detected line is a redundant line needs to be determined.

In conclusion, when the chip circuit is verified, not only verification accuracy, but also verification efficiency and a verification coverage rate need to be ensured. An ATPG-based detection method may be used when a circuit is verified. According to the ATPG-based detection method, a detectable fault and a difficult-to-detect fault in the circuit may be detected. In addition, when it is determined that the circuit fault type is a detectable fault, a test pattern may be generated, and the test pattern may be used to detect the circuit fault. The following describes two common ATPG-based testing methods.

Manner 1: ATPG-Based Detection Method According to a D Algorithm.

When ATPG-based detection is performed according to the D algorithm, a plurality of lines included in a circuit under test are respectively tested, and if any one of the lines is faulty, a set of initially allocated values is selected, and the initially allocated values are transmitted from an input end of the circuit to an output end of the circuit according to a logic rule of the circuit under test. When there is no further circuit branch to which the values can be transmitted and there is no collision, an implicit value of each connection line in the circuit under test can be inferred, and a location of the fault can be determined by comparing with the truth table of the circuit under test. If a conflict occurs during transmission, that is, assuming that a line is faulty but no fault occurs during transmission, a new line needs to be selected for testing.

According to the foregoing method, when a circuit fault is found, the D algorithm may be stopped, indicating that the fault type corresponding to the currently detected line is a detectable fault, and during actual fault detection, allocation of the circuit under test for fault detection may be adjusted based on a detection result. For example, faults that are logically better detected are first detected. If an entire search space is used or a specified quantity of detection times or a detection time is exceeded, and a solution for circuit fault detection is still not obtained, the D algorithm is stopped and the fault type corresponding to the currently detected line is considered as a difficult-to-detect fault.

It can be learned from the foregoing description that, when ATPG-based detection is performed according to the D algorithm, detection efficiency is affected by selection of the initially allocated values. If the initially allocated values are not properly selected, a detection time of the circuit under test may be severely affected. In addition, the ATPG-based detection according to the D algorithm usually needs to use the entire search space to determine the fault type as a difficult-to-detect fault, which is time-consuming and costly.

Manner 2: ATPG-Based Detection Method According to an SAT Algorithm.

When ATPG-based detection is performed according to the SAT algorithm, each line of the circuit under test needs to be detected. A CNF is generated for each line and solved. The CNF corresponding to each line is generated based on a circuit structure and a circuit propagation characteristic. For example, the target line is detected. A CNF corresponding to the target line is generated, and the CNF may be used to describe a proposition of "assuming that the target line is faulty".

After the CNF corresponding to the target line is generated, satisfiability (SAT) solution needs to be performed on the CNF. Specifically, performing SAT solution on the CNF corresponding to the target line may be understood as determining whether there is a set of variable values that can make the proposition of "assuming that the target line is faulty" true. A result of performing SAT solution on the CNF corresponding to the target line may include satisfiable and unsatisfiable. When the SAT solution result of the CNF corresponding to the target line is satisfiable, it indicates that there is a set of variable values that can make the proposition of "assuming that the target line is faulty" true, the fault type of the target line is a detectable fault, and in this case, the determined set of variable values may be used as the test pattern. When a circuit fault of the circuit under test is detected, the test pattern may be used as an input value of the circuit under test to obtain an output value of the circuit under test, and the circuit fault is detected by comparing an accurate output value with an actual output value of the circuit under test. When the SAT solution result of the CNF corresponding to the target line is unsatisfiable, it indicates that there is no set of variable values that can make the proposition of "assuming that the target line is faulty" true, that is, the proposition of "assuming that the target line is faulty" is not valid regardless of which input value is given. The fault type of the target line is a difficult-to-detect fault. In this case, whether the target line is a redundant line needs to be checked.

During specific implementation, the performing SAT solution on the CNF corresponding to the target line may be inputting the CNF into an SAT solver for solution, where the SAT solver is a black-box solver. After the CNF corresponding to the target line is input to the SAT solver, the SAT solution result output by the SAT solver may be directly obtained. Specifically, the SAT solver may output the SAT solution result of the CNF corresponding to the target line as satisfiable, and output a test pattern. In this case, it may be determined that the fault type of the target line is a detectable fault. Alternatively, the SAT solver may output the SAT solution result of the CNF corresponding to the target line as unsatisfiable. In this case, it may be determined that the fault type of the target line is a difficult-to-detect fault.

Figure 6A:
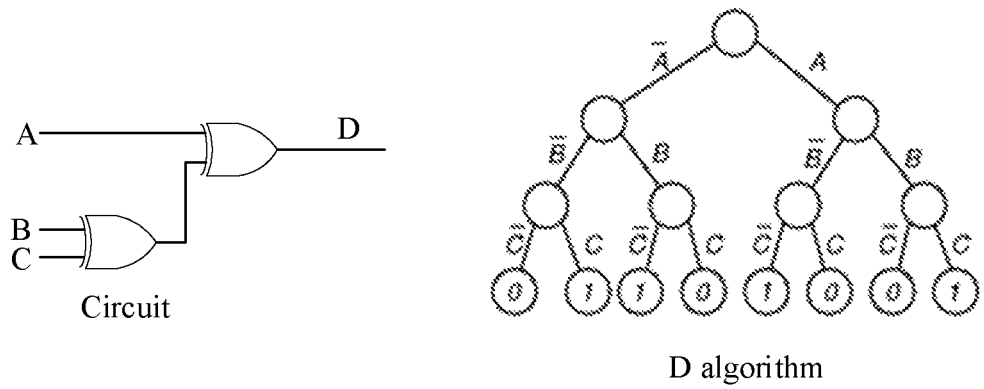
FIG. 6A is a schematic diagram of a D algorithm solution process.
Figure 6B:
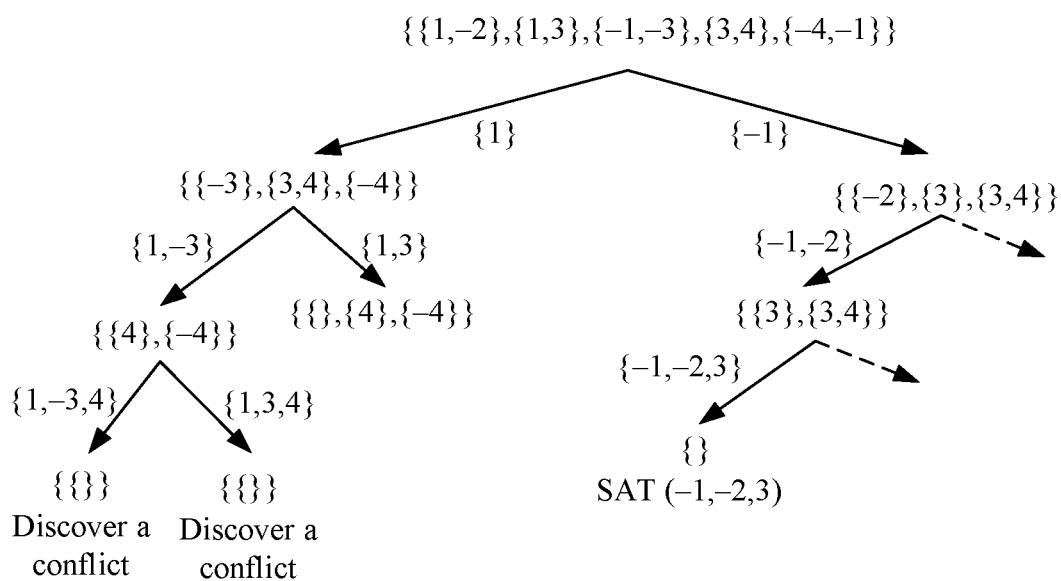
FIG. 6B is a schematic diagram of an SAT algorithm solution process.

FIG. 6A is a schematic diagram of a D algorithm solution process, and FIG. 6B is a schematic diagram of an SAT algorithm solution process. Both the D algorithm and the SAT algorithm are branch-and-bound algorithms. However, the D algorithm is a heuristic algorithm, and the SAT algorithm is a symbol calculation method. Refer to FIG. 6A. Although a tree search process is used, each branch of the tree in the D algorithm represents a solution. In a solution process of the D algorithm in FIG. 6A, one branch corresponds to a value of a node in the circuit shown in FIG. 6A. However, in the SAT method, due to a characteristic of symbol calculation, each node may represent a set of solutions. Refer to a schematic diagram of an SAT algorithm in FIG. 6B. Numbers in { } represent indexes of four variables. For example, {1, 2, 3, and 4} indicates that variables are {1, 1, 1, 1}, {3, −4} indicates that the third variable is 1 and the fourth variable is 0, and other variables can be 1 or 0. It can be learned from the SAT algorithm solution process shown in FIG. 6B that each node may represent a set of solutions, and the set of solutions may include a plurality of cases. Therefore, in theory, the SAT-based method is more suitable for the solution and determining of a hard case that requires global traversal.

However, as complexity of the circuit structure of the circuit under test increases, the time for generating the CNF is longer when the ATPG-based detection is performed based on SAT. For example, for a circuit under test with tens of thousands of gate circuits, during serial calculation, a time for generating the CNF is far greater than a time for solving the. This increases a verification time of the chip circuit and reduces verification efficiency of the chip circuit.

In conclusion, low efficiency exists in currently common ATPG-based detection methods.

Based on the foregoing problem, an embodiment of this application provides an ATPG-based circuit verification method, to improve circuit verification efficiency.

Figure 7:
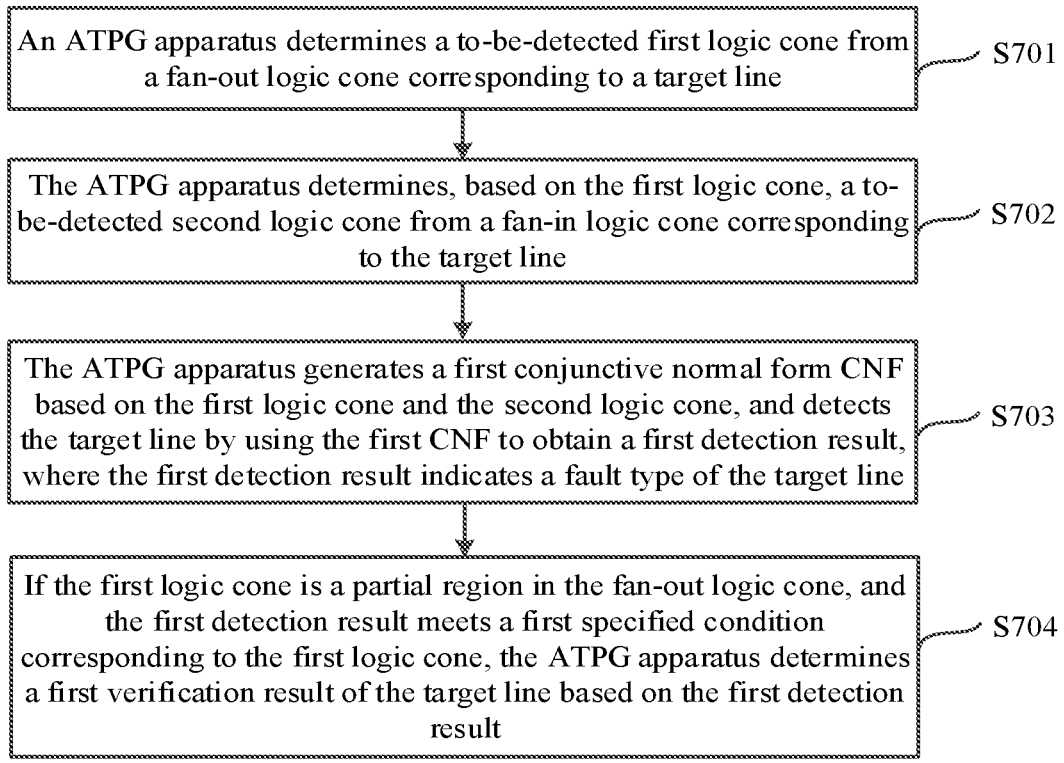
FIG. 7 is a flowchart of an automatic test pattern generation-based circuit verification method according to an embodiment of this disclosure.

FIG. 7 is a flowchart of an ATPG-based circuit verification method according to an embodiment of this disclosure. The ATPG-based circuit verification method provided in this embodiment of this disclosure may be applied to an ATPG apparatus, or may be applied to an ATPG module in a chip. For example, the ATPG module may be an ATPG module in an electronic design automation (EDA) process. The following describes the ATPG-based circuit verification method provided in this embodiment of this disclosure by using an example in which the ATPG-based circuit verification method provided in this embodiment of this disclosure is applied to the ATPG apparatus. During specific implementation, the ATPG apparatus needs to detect each line in a circuit under test, that is, each line in the circuit under test needs to be traversed. The following describes the ATPG-based circuit verification method provided in this embodiment of this disclosure by using an example in which the ATPG apparatus detects a target line, and the target line is any line in a plurality of lines included in the circuit under test. When the ATPG apparatus detects the target line, the following steps are performed.

S701: The ATPG apparatus determines a to-be-detected first logic cone from a fan-out logic cone corresponding to the target line.

Figure 8:
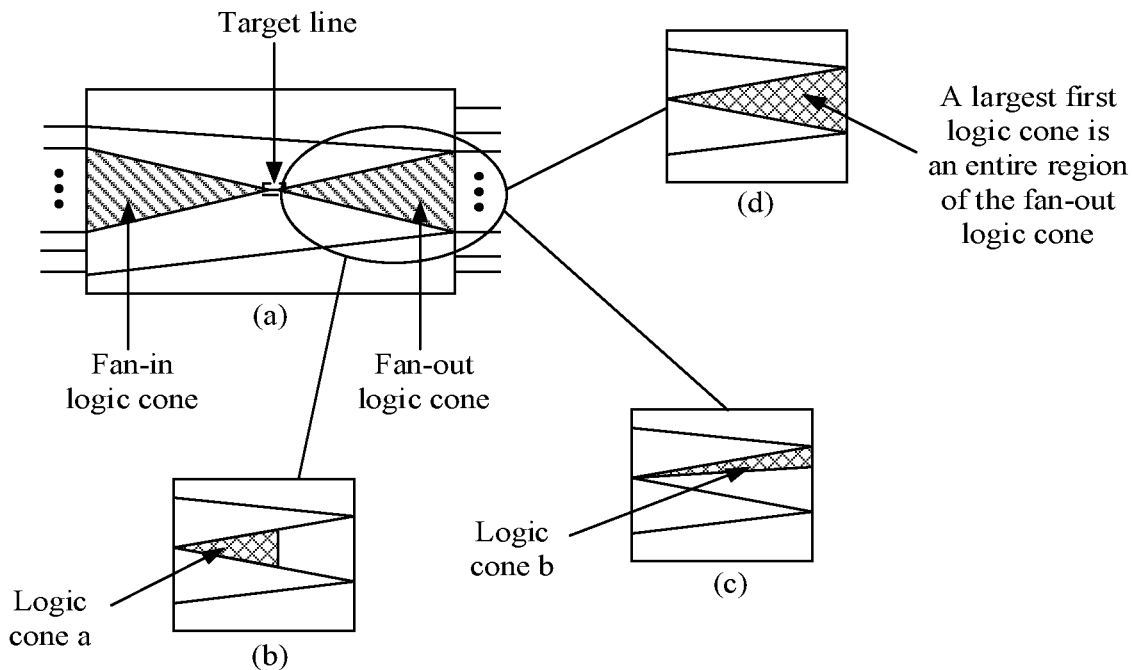
FIG. 8 is a schematic diagram of a fan-out logic cone corresponding to a target line and a first logic cone according to an embodiment of this disclosure.

Optionally, FIG. 8 is a schematic diagram of a fan-out logic cone corresponding to a target line and a first logic cone according to an embodiment of this disclosure. Refer to (a) in FIG. 8. The fan-out logic cone is a region formed by a gate circuit that passes from the target line to an output end of the circuit under test. It may be considered that a value of the target line may affect an input value and/or an output value of each gate circuit in the fan-out logic cone.

In an optional implementation, in this embodiment of this disclosure, when determining the first logic cone from the fan-out logic cone corresponding to the target line, the ATPG apparatus may determine a partial depth region from the fan-out logic cone as the first logic cone. For example, refer to (b) in FIG. 8. If a logic cone a is the partial depth region in the fan-out logic cone, the logic cone a may be used as the first logic cone. Alternatively, the ATPG apparatus may determine a region that is in the fan-out logic cone and that includes a part of output ends as the first logic cone. For example, refer to (c) in FIG. 8. If a logic cone b is a region including the part of output ends in the fan-out logic cone, the logic cone b may be used as the first logic cone.

It should be noted that in the ATPG-based circuit verification method provided in this embodiment of this disclosure, when detecting the target line, the ATPG apparatus may first use a partial region of the fan-out logic cone corresponding to the target line as the first logic cone. When a first detection result corresponding to the target line is not determined based on the first logic cone, the first logic cone may be re-divided, for example, a region of the first logic cone is increased, to implement an incremental division manner. It may be understood that, when the ATPG apparatus performs division on the first logic cone a plurality of times, a largest first logic cone that can be determined is an entire region of the fan-out logic cone. For example, as shown in (d) in FIG. 8, when the first logic cone is determined based on a depth, the largest first logic cone that can be determined by the ATPG apparatus is the entire region of the fan-out logic cone.

S702: The ATPG apparatus determines, based on the first logic cone, a to-be-detected second logic cone from a fan-in logic cone corresponding to the target line.

Refer to FIG. 8. The fan-in logic cone is a region formed by a gate circuit that passes from an input end of the circuit under test to the target line. The ATPG apparatus may determine a region that is in the fan-in logic cone and that is formed by a gate circuit that affects an output value of the first logic cone, and the determined region is used as the second logic cone. The second logic cone may be a partial region or an entire region of the fan-in logic cone.

According to this embodiment of this disclosure, the ATPG apparatus may determine a fault type of the target line by detecting the gate circuit included in the first logic cone and the gate circuit included in the second logic cone.

S703: The ATPG apparatus generates a first conjunctive normal form CNF based on the first logic cone and the second logic cone, and detects the target line by using the first CNF to obtain a first detection result, where the first detection result indicates the fault type of the target line.

Optionally, that the ATPG apparatus detects the target line by using the first CNF may be that the ATPG apparatus performs SAT solution on the first CNF, determines an SAT solution result of the first CNF, and determines the first detection result based on the SAT solution result of the first CNF. It can be learned from the foregoing description of the SAT solution that the SAT solution result of the first CNF may be unsatisfiable and satisfiable. If the SAT solution result of the first CNF is unsatisfiable, it indicates that the proposition of "assuming that the target line is faulty" corresponding to the first CNF is not true regardless of an input value for the circuit under test. In this case, the first detection result determined based on the solution result of the first CNF is a difficult-to-detect fault. If the SAT solution result of the first CNF is satisfiable, it indicates that there is a set of pattern values. When the set of pattern values is used as an input value of the circuit under test, the proposition of "assuming that the target line is faulty" corresponding to the first CNF is true. In this case, the first detection result determined based on the solution result of the first CNF is a detectable fault, and the set of determined pattern values may be used as test patterns for fault detection on the circuit under test.

Optionally, the first CNF includes at least one clause, and the at least one clause is generated based on a gate circuit in the first logic cone and a gate circuit in the second logic cone. Each clause may represent a constraint condition, and the first CNF including the at least one clause may describe the proposition of "assuming that the target line is faulty". When the SAT solution result of the first CNF is satisfiable, it indicates that there is a set of patterns that can make the first CNF true, that is, there is a set of patterns that can make the proposition of "assuming that the target line is faulty" true. In this case, the first detection result is a detectable fault. In this case, when the target line is faulty, the fault can be found. When the SAT solution result of the first CNF is unsatisfiable, it indicates that there is no set of patterns that can make the first CNF true, that is, the proposition of "assuming that the target line is faulty" is not true. In this case, the first detection result is a difficult-to-detect fault. In this case, whether the target line is a redundant line needs to be checked.

To further improve efficiency of detecting the target line, an embodiment of this disclosure further provides an SAT solution method. Specifically, before performing solution on the first CNF, it is determined whether a quantity of clauses included in the first CNF is less than a specified threshold. When the quantity of clauses included in the first CNF is less than a specified threshold, the first CNF is input to an SAT solver, and an SAT solution result output by the SAT solver is obtained.

Figure 9:
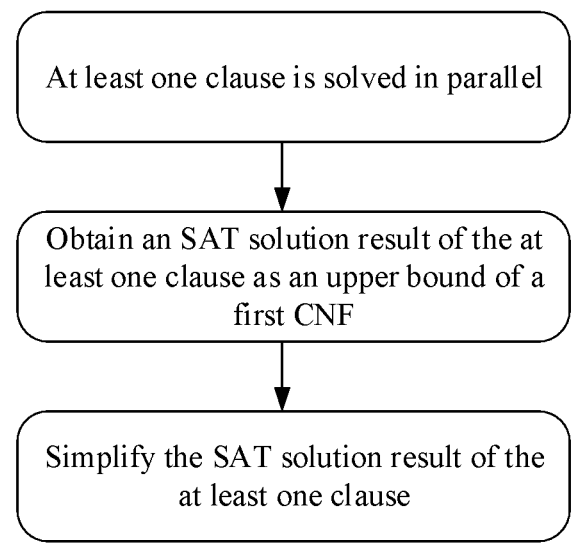
FIG. 9 is a schematic diagram of a sequence decision calculation method according to an embodiment of this disclosure.

When the quantity of clauses included in the first CNF is greater than or equal to the specified threshold, a sequence decision method of looking ahead calculation may be used to solve the first CNF. The method is an optimization method for online prediction, and a final decision may be predicted in advance by using an intermediate result of optimization. For example, FIG. 9 is a schematic diagram of a sequence decision method. In the method, at least one clause is solved in parallel, and an SAT solution result of each clause is determined. It may be understood that the first CNF may include a plurality of clauses, each clause corresponds to one constraint condition, and a result obtained by performing SAT solution on the first CNF is a result of satisfying all constraint conditions corresponding to all clauses. When SAT solution is performed on only one of the clauses, an obtained solution result meets only one constraint condition. To be specific, a result of performing SAT solution on one clause is an intermediate result, but is not an SAT solution result corresponding to the first CNF. However, a range of the SAT solution result obtained by performing SAT solution on one clause is greater than the SAT solution result of the first CNF. Therefore, the SAT solution result of each clause is an upper bound of the SAT solution result of the first CNF. After performing SAT solution on each of the at least one clause included in the first CNF, the ATPG apparatus may simplify an SAT solution result of the at least one clause, for example, use an intersection of SAT solution results of the at least one clause as the SAT solution result of the first CNF.

Optionally, when the first CNF is solved by using the sequence decision method of looking ahead, the ATPG apparatus may further extract the clauses in the first CNF in a sampling manner for solution. For example, when the first CNF includes N clauses, M clauses in the clauses may be randomly sampled for parallel solution, where M<N. In addition, the remaining N−M clauses are simultaneously solved, and an intersection of a plurality of obtained SAT solution results is used as the SAT solution result of the first CNF. In actual calculation, K clauses can be simultaneously extracted to enhance the online prediction result, where K is an integer greater than 1.

S704: If the first logic cone is a partial region in the fan-out logic cone, and the first detection result meets a first specified condition corresponding to the first logic cone, the ATPG apparatus determines a first verification result of the target line based on the first detection result.

In an optional implementation, when the first logic cone is the partial region in the fan-out logic cone, and the first detection result meets the first specified condition corresponding to the first logic cone, the ATPG apparatus may determine the first verification result of the target line based on the first detection result. For example, the first detection result is used as the first verification result.

It may be understood that, when the target line is detected, a CNF is directly generated based on the fan-out logic cone and the fan-in logic cone that correspond to the target line, and accuracy of an obtained detection result can be ensured when the target line is detected by using the CNF. However, it can be learned from the foregoing description that when the circuit structure is complex, it takes a long time to generate a CNF based on the fan-out logic cone and the fan-in logic cone and perform SAT solution on the CNF, resulting in low circuit verification efficiency. Therefore, in this embodiment of this disclosure, the first logic cone may be determined from the fan-out logic cone. When the first logic cone is the partial region in the fan-out logic cone, the first verification result cannot be directly generated based on the first detection result, and the first specified condition needs to be set. When the first detection result meets the first specified condition, the first verification result is generated based on the first detection result, to ensure accuracy of the first verification result.

It should be noted that different first logic cones may be obtained in different division manners of the first logic cones, and the first logic cones in different division manners respectively correspond to different first specified conditions. The following separately describes the first logic cones obtained in different division manners and manners of determining the first verification result in embodiments of this disclosure.

Manner 1: The ATPG apparatus determines, based on an initial depth value and a first step value, the first logic cone from the fan-out logic cone.

It should be noted that the initial depth value is a distance between the target line and the gate circuit.

Figure 10:
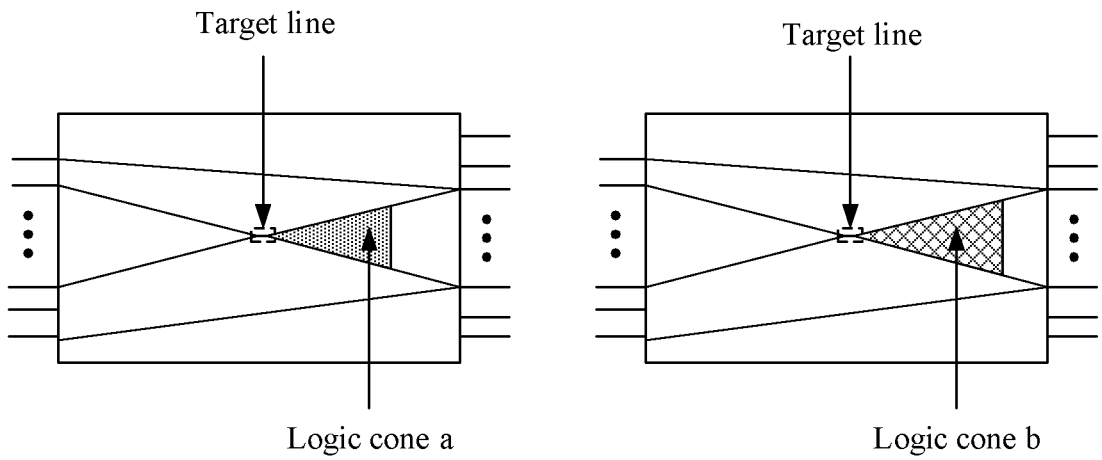
FIG. 10 is a schematic diagram of a first division manner of a first logic cone according to an embodiment of this disclosure.

FIG. 10 is a schematic diagram of a first division manner of a first logic cone. Optionally, when determining a fault type of a target line, the ATPG apparatus may first divide, from the first logic cone, a region whose depth is an initial depth value as the first logic cone. For example, the first logic cone obtained through division may be a logic cone a in FIG. 10. The ATPG apparatus uses a region that is in a fan-in region and that is formed by a gate circuit that affects an output value of the first logic cone as a second logic cone. A first CNF is generated based on the first logic cone and the second logic cone, and SAT solution is performed on the first CNF to obtain a first detection result.

In the division manner provided in Manner 1, the first specified condition corresponding to the first logic cone is that the fault type in the first detection result is a difficult-to-detect fault, or may also be understood as that an SAT solution result of the first CNF is unsatisfiable. To be specific, when the fault type in the first detection result is the difficult-to-detect fault, the ATPG apparatus may determine a first verification result of the target line based on the first detection result. For example, the ATPG apparatus may use the first detection result as the first verification result.

It may be understood that performing SAT solution on the first CNF is to determine whether there is a set of pattern values that can make a result of the first CNF true, that is, make a proposition of "assuming that the target line is faulty" true. When the SAT solution result of the first CNF is unsatisfiable, it indicates that there is no set of pattern values that can make the result of the first CNF true. In this case, even if the depth of the first logic cone is increased, it cannot be determined that there is the set of pattern values that can make the result of the first CNF true. Therefore, the first detection result obtained by detecting the target line based on the first CNF corresponding to the current first logic cone may be considered as the first verification result of the target line. According to the method, accuracy of the detection result of the target line can be ensured, and CNFs do not need to be generated for an entire fan-in region and an entire fan-out region. This improves circuit verification efficiency.

In addition, when the first detection result does not satisfy the first specified condition, that is, the SAT solution result of the first CNF is satisfiable, the ATPG apparatus may return to performing the step of determining the first logic cone and the second logic cone. In this case, the ATPG apparatus may determine the first logic cone from the fan-out logic cone based on the initial depth value and the first step value. For example, the first step value is added to the initial depth value to determine a depth value. The ATPG apparatus uses, as the first logic cone, a region corresponding to the depth value in the fan-out logic cone. For example, refer to FIG. 10. The determined first logic cone may be a logic cone b, to complete re-division of the first logic cone. Similarly, a region that is in the fan-out logic cone and that affects an output value of the first logic cone is determined, and the region is used as the re-divided second logic cone. The first CNF is generated again based on the first logic cone and the second logic cone, and the step of detecting the target line based on the first CNF is repeated.

Optionally, the ATPG apparatus may repeat the step of determining the first logic cone and the second logic cone, and detecting the target line based on the first CNF, until the fault type in the first detection result is a difficult-to-detect fault. Alternatively, when the first logic cone determined by the ATPG apparatus is an entire region of the fan-out logic cone, whether the first detection result meets the first specified condition does not need to be determined again, and the first verification result may be determined directly based on the first detection result.

It should be noted that, when determining a first logic cone again, the ATPG apparatus may add a specified quantity of first step values to a depth value of the first logic cone that is determined last time, to determine the first logic cone in an incremental manner. Compared with a current manner of detecting a target line directly based on a fan-out region and a fan-in region, an amount of calculation is reduced and circuit verification efficiency is improved.

Figure 11:
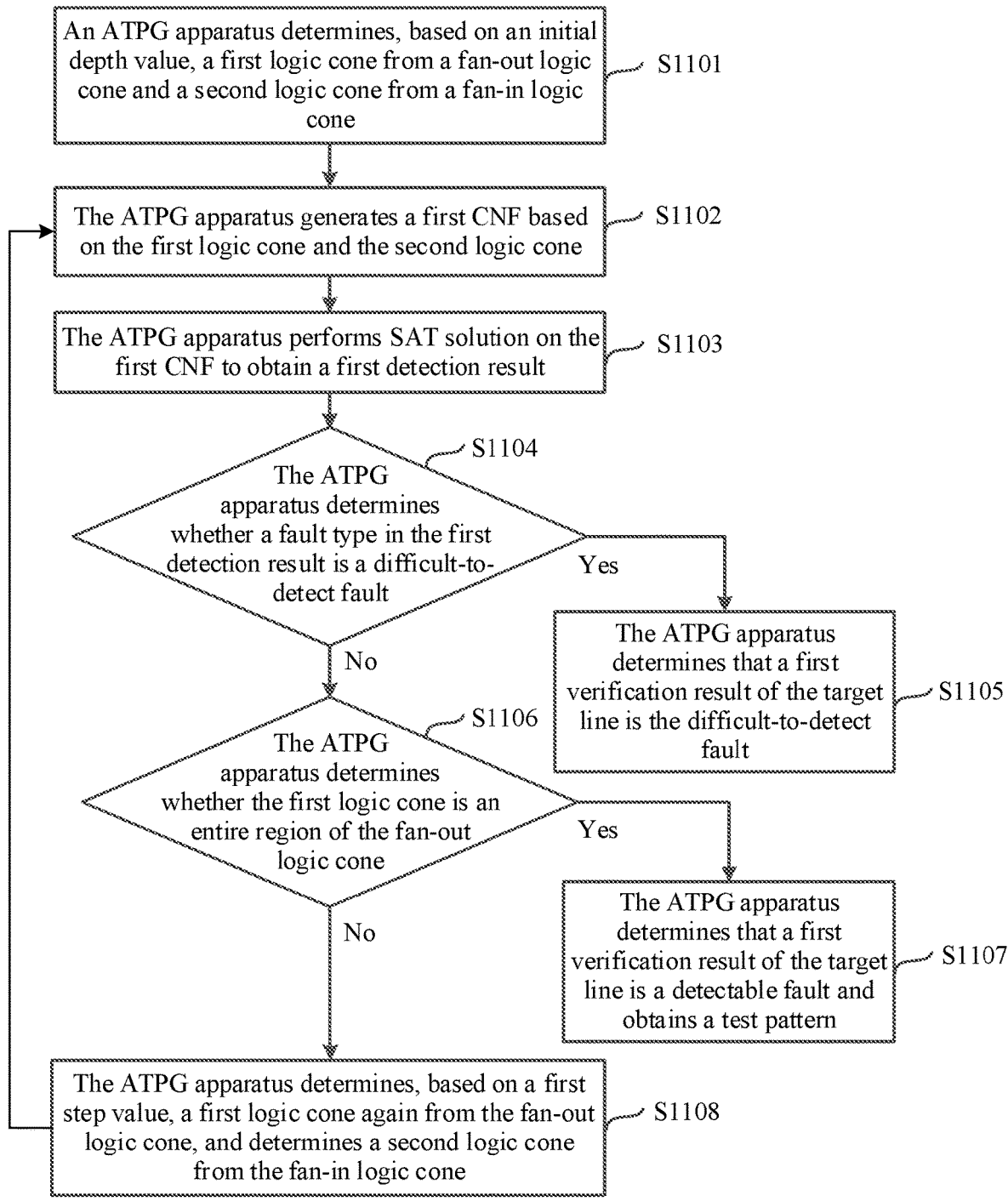
FIG. 11 is a flowchart of a method for detecting a target line in a first division manner of a first logic cone according to an embodiment of this disclosure.

The following further describes a method for detecting a target line based on Manner 1 by using an instance. FIG. 11 is a flowchart of a method for detecting a target line based on Manner 1. The method may include the following steps.

S1101: The ATPG apparatus determines, based on an initial depth value, a first logic cone from a fan-out logic cone and a second logic cone from a fan-in logic cone.

S1102: The ATPG apparatus generates a first CNF based on the first logic cone and the second logic cone.

S1103: The ATPG apparatus performs SAT solution on the first CNF to obtain a first detection result.

S1104: The ATPG apparatus determines whether a fault type in the first detection result is a difficult-to-detect fault. If the fault type in the first detection result is a difficult-to-detect fault, S1105 is performed; or if the fault type in the first detection result is not a difficult-to-detect fault, S1106 is performed.

S1105: The ATPG apparatus determines that a first verification result of the target line is the difficult-to-detect fault.

S1106: The ATPG apparatus determines whether the first logic cone is an entire region of the fan-out logic cone. If the first logic cone is the entire region of the fan-out logic cone, S1107 is performed; or if the first logic cone is not the entire region of the fan-out logic cone, S1108 is performed.

S1107: The ATPG apparatus determines that a first verification result of the target line is a detectable fault and obtains a test pattern.

S1108: The ATPG apparatus determines, based on a first step value, a first logic cone again from the fan-out logic cone, and determines a second logic cone from the fan-in logic cone.

Manner 2: The ATPG apparatus determines, based on a preset quantity of output ends and a second step value, the first logic cone from the fan-out logic cone.

Figure 12:
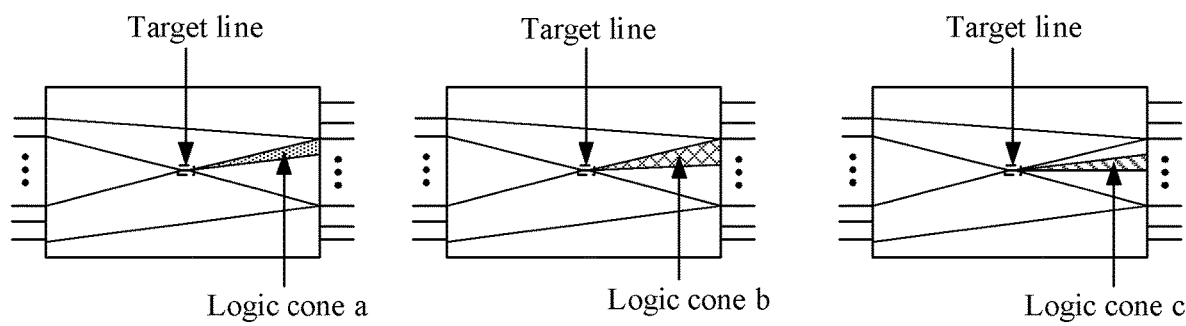
FIG. 12 is a schematic diagram of a second division manner of a first logic cone according to an embodiment of this disclosure.

FIG. 12 is a schematic diagram of a second division manner of a first logic cone. Optionally, when determining a fault type of a target line, the ATPG apparatus may first divide, from the first logic cone, a region including a preset quantity of output ends as the first logic cone. For example, the first logic cone obtained through division may be a logic cone a in FIG. 12. The ATPG apparatus uses a region that is in a fan-in region and that is formed by a gate circuit that affects an output value of the first logic cone as a second logic cone. A first CNF is generated based on the first logic cone and the second logic cone, and SAT solution is performed on the first CNF to obtain a first detection result.

In the division manner provided in Manner 2, the first specified condition corresponding to the first logic cone is that the fault type in the first detection result is a detectable fault, or may also be understood that an SAT solution result of the first CNF is SAT. To be specific, when the first detection result is the detectable fault, the ATPG apparatus may determine a first verification result of the target line based on the first detection result. For example, the ATPG apparatus may use the first detection result as the first verification result.

It may be understood that performing SAT solution on the first CNF is to determine whether there is a set of pattern values that can make a result of the first CNF true. When the SAT solution result of the first CNF is satisfiable, it indicates that there is a set of pattern values that can make the result of the first CNF true. If the result of the first CNF is true, it indicates that the proposition of "assuming that the target line is faulty" is true. To be specific, in the current first logic cone, the proposition of "assuming that the target line is faulty" can be true. Even if a quantity of output ends included in the first logic cone is increased, a result that "there is a set of patterns that can make the result of the first CNF true" is not changed. Therefore, the first detection result obtained by detecting the target line based on the first CNF corresponding to the current first logic cone may be considered as the first verification result of the target line. According to the method, accuracy of the detection result of the target line can be ensured, and CNFs do not need to be generated for an entire fan-in region and an entire fan-out region. This improves circuit verification efficiency.

In addition, when the first detection result does not satisfy the first specified condition, that is, the SAT solution result of the first CNF is unsatisfiable, the ATPG apparatus may return to performing the step of determining the first logic cone and the second logic cone. In this case, the ATPG apparatus may determine the first logic cone from the fan-out logic cone based on the preset quantity of output ends and the second step value. For example, a quantity value is determined by adding the second step value to the preset quantity of output ends. A region that is in the fan-out region and that includes the quantity of output ends is used as the first logic cone, to complete re-division of the first logic cone. For example, the re-divided first logic cone may be a logic cone b in FIG. 12. Similarly, the ATPG apparatus may determine a region that is in the fan-out logic cone and that affects an output value of the first logic cone as the second logic cone obtained after re-division.

It should be noted that the first logic cone obtained after the ATPG apparatus performs re-division may include the first logic cone determined last time. Alternatively, the first logic cone obtained after the re-division performed by the ATPG apparatus may not include the first logic cone determined last time. For example, the first logic cone obtained after the re-division may be a logic cone c in FIG. 12. If the re-divided first logic cone does not include the first logic cone determined last time, division may still be performed based on the preset quantity of output ends when the first logic cone is re-divided. In other words, in this case, the second step value may be 0.

After determining a first logic cone and a second logic cone again, the ATPG apparatus may generate the first CNF again based on the first logic cone and the second logic cone, and repeat the step of detecting the target line based on the first CNF.

Optionally, the ATPG apparatus may repeatedly determine the first logic cone and the second logic cone, and detect the target line based on the first CNF, until the fault type in the first detection result is a detectable fault. Alternatively, when the first logic cone determined by the ATPG apparatus is an entire region of the fan-out logic cone, or all determined first logic cones have traversed an entire region of the fan-out logic cone, whether the first detection result meets the first specified condition does not need to be determined again, and the first verification result may be determined directly based on the first detection result.

It should be noted that, when determining a first logic cone again, the ATPG apparatus may add a specified quantity of second step values to a quantity of output ends of the first logic cone that is determined last time, to determine the first logic cone in an incremental manner. Compared with a current manner of detecting a target line directly based on a fan-out region and a fan-in region, an amount of calculation is reduced and circuit verification efficiency is improved.

Figure 13:
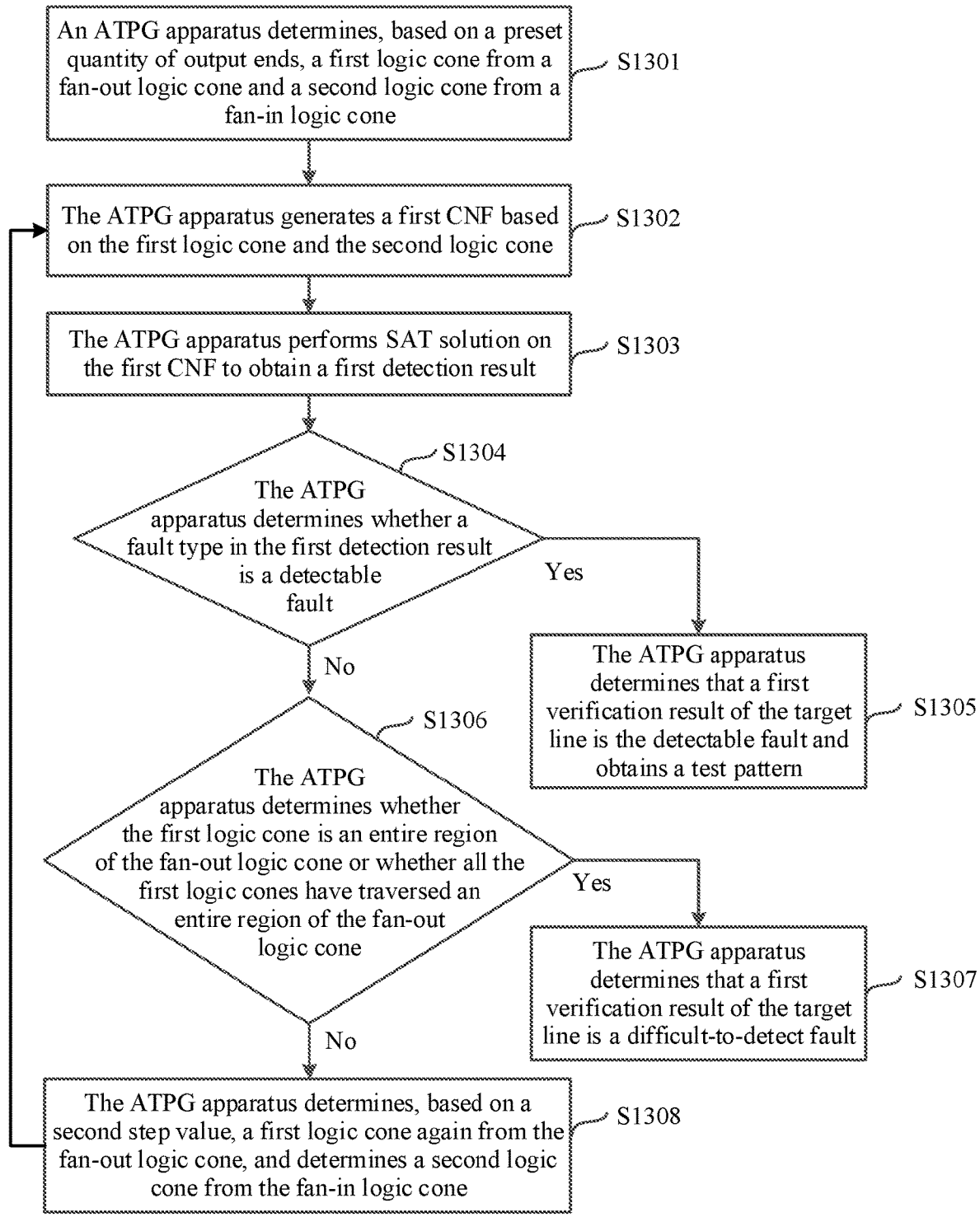
FIG. 13 is a flowchart of a method for detecting a target line in a second division manner of a first logic cone according to an embodiment of this disclosure.

The following further describes a method for detecting a target line based on Manner 2 by using an instance. FIG. 13 is a flowchart of a method for detecting a target line based on Manner 2. The method may include the following steps.

S1301: The ATPG apparatus determines, based on a preset quantity of output ends, a first logic cone from a fan-out logic cone and a second logic cone from a fan-in logic cone.

S1302: The ATPG apparatus generates a first CNF based on the first logic cone and the second logic cone.

S1303: The ATPG apparatus performs SAT solution on the first CNF to obtain a first detection result.

S1304: The ATPG apparatus determines whether a fault type in the first detection result is a detectable fault. If the fault type in the first detection result is a detectable fault, S1305 is performed; or if the fault type in the first detection result is not a detectable fault, S1306 is performed.

S1305: The ATPG apparatus determines that the first verification result of the target line is the detectable fault and obtains a test pattern.

S1306: The ATPG apparatus determines whether the first logic cone is an entire region of the fan-out logic cone or whether all the first logic cones have traversed an entire region of the fan-out logic cone. If the first logic cone is the entire region of the fan-out logic cone or all the first logic cones have traversed the entire region of the fan-out logic cone, S1307 is performed; or if the first logic cone is not the entire region of the fan-out logic cone or not all the first logic cones have traversed the entire region of the fan-out logic cone, S1308 is performed.

S1307: The ATPG apparatus determines that a first verification result of the target line is a difficult-to-detect fault.

S1308: The ATPG apparatus determines, based on a second step value, a first logic cone again from the fan-out logic cone, and determines a second logic cone from the fan-in logic cone.

In an optional implementation of this application, the ATPG apparatus may detect the target line by using a dual-thread method. One thread may detect the target line according to the method provided in Manner 1, and the other thread may detect the target line according to the method provided in Manner 2. Specifically, the ATPG apparatus may start the first thread to determine the first logic cone and the second logic cone, and then generate the first CNF to detect the target line, to determine the first verification result. Simultaneously, the ATPG apparatus may further start the second thread to determine a third logic cone and a fourth logic cone, generate a second CNF based on the third logic cone and the fourth logic cone, and detect the target line based on the second CNF to determine a second verification result. For the method for determining the third logic cone and the fourth logic cone by the ATPG apparatus in the second thread and the method for detecting the target line based on the second CNF, refer to the implementation of Manner 1 or Manner 2. Details are not described again. It should be noted that, when the ATPG apparatus detects the target line by using the dual-thread method, manners of determining the first logic cone and the third logic cone are different. After the verification result is determined in one of the two threads, the other thread may stop working. For example, when first determining the first verification result in the first thread, the second thread stops working; or when the second verification result is first determined in the second thread, the first thread stops working.

According to the foregoing method, the ATPG apparatus may determine, by using two threads, whether the fault type of the target line is a difficult-to-detect fault or a detectable fault, and may end detection of the target line after the verification result is determined in one thread. This further improves circuit verification efficiency.

It can be learned from the foregoing description of the chip circuit that an integrated circuit in some chips is larger, for example, tens of thousands of gate circuits are integrated. For a chip with a larger circuit, when verification is performed on the chip circuit in this embodiment of this application, decomposition processing and/or simplification processing may alternatively be performed on the circuit. The following separately describes a circuit decomposition processing method and a circuit simplification processing method provided in embodiments of this application.

1. Circuit Decomposition Processing Method.

Before determining the to-be-detected first logic cone from the fan-out logic cone, if determining that a quantity of gate circuits included in the fan-in logic cone and the fan-out logic cone is greater than a first specified threshold, the ATPG apparatus determines at least one target sub-circuit in the fan-in logic cone and at least one target sub-circuit in the fan-out logic cone, where the target sub-circuit may be an FFR.

Optionally, that the ATPG apparatus determines that a quantity of gate circuits included in the fan-in logic cone and the fan-out logic cone is greater than a first specified threshold may be specifically that: The ATPG apparatus determines that a quantity of gate circuits in the fan-in logic cone and the fan-out logic cone meets at least one of the following conditions. Condition 1: A total quantity of gate circuits is greater than a first specified threshold; Condition 2: A quantity of fan-in gate circuits is greater than a first specified threshold; or Condition 3: A quantity of fan-out gate circuits is greater than a first specified threshold.

The first specified threshold may be an empirical value.

Optionally, after determining that the quantity of gate circuits included in the fan-in logic cone and the fan-out logic cone is greater than the first specified threshold, the ATPG apparatus may identify an FFR in the fan-in logic cone and the fan-out logic cone, and use each FFR as a target sub-circuit. After determining the first logic cone and the second logic cone, when generating the first CNF based on a gate circuit in the first logic cone and a gate circuit in the second logic cone, the ATPG apparatus may separately generate corresponding clauses for target sub-circuits included in the first logic cone and the second logic cone. Each target sub-circuit corresponds to a clause. It may be understood that a condition for a fault to propagate to any output end within an FFR is the same. Therefore, a fault propagated to a root node within an FFR may be represented by a clause. According to the method, the method for generating the first CNF can be simplified. This reduces a time required for generating the CNF, and improves circuit verification efficiency.

2. Circuit Simplification Processing Method.

If determining that the quantity of gate circuits included in the fan-in logic cone and the fan-out logic cone is greater than a second specified threshold before determining the to-be-detected first logic cone from the fan-out logic cone, the ATPG apparatus simplifies two equivalent gate circuits in the fan-in logic cone and the fan-out logic cone into one gate circuit for generating a CNF clause, where the two equivalent gate circuits are two gate circuits with the same input and the same output.

Optionally, the second specified threshold may be less than the first specified threshold. That is, during implementation, circuit decomposition processing and/or circuit simplification processing do not need to be performed on all circuits. The circuit simplification processing is performed when the quantity of gate circuits included in the fan-in logic cone and the fan-out logic cone is greater than the second specified threshold; and the circuit decomposition processing is performed when the quantity of gate circuits included in the fan-in logic cone and the fan-out logic cone is greater than the first specified threshold.

Optionally, that the ATPG apparatus determines that a quantity of gate circuits included in the fan-in logic cone and the fan-out logic cone is greater than a second specified threshold may be specifically that the ATPG apparatus determines that a quantity of gate circuits in the fan-in logic cone and the fan-out logic cone meets at least one of the following conditions. Condition 1: A total quantity of gate circuits is greater than a second specified threshold; Condition 2: A quantity of fan-in gate circuits is greater than a second specified threshold; or Condition 3: A quantity of fan-out gate circuits is greater than a second specified threshold.

The second specified threshold may be an empirical value.

In an optional implementation, when the circuit corresponding to the fan-in logic cone and the fan-out logic cone is simplified, the circuit may be converted from a gate-level netlist form to a sum of product (SOP) form. A hash table corresponding to the fan-in logic cone and the fan-out logic cone is designed, and the circuit is preliminarily simplified by using a table lookup method. Specifically, if it is determined, according to the hash table, that outputs of two gate circuits with same inputs are also the same, it may be considered that the two gate circuits are equivalent. Further, a random pattern may be generated, and equivalence evaluation is performed on two gate circuits with the same input. For example, accurate calculation may be performed by using an SAT solver, to determine whether the two gate circuits are completely equivalent. After it is determined that the two gate circuits are equivalent, the two gate circuits may be simplified into one gate circuit for generating the CNF.

Optionally, after the circuit is simplified until the quantity of gate circuits is less than or equal to the specified threshold, the simplification processing on the circuit may be stopped, or when there is no equivalent gate circuit in the circuit, the simplified processing on the circuit may be stopped.

According to the method, equivalent gate circuits in the circuit corresponding to the fan-in logic cone and the fan-out logic cone may be simplified, to reduce a quantity of gate circuits that need to be considered when the first CNF is generated. This reduces difficulty in generating the first CNF and improves circuit verification efficiency.

It should be noted that the circuit decomposition processing method may be executed by a circuit decomposition module in the ATPG apparatus, and the circuit simplification processing method may be executed by a circuit simplification module in the ATPG apparatus. The circuit decomposition module and the circuit simplification module may be plug-and-play modules.

Figure 14A:
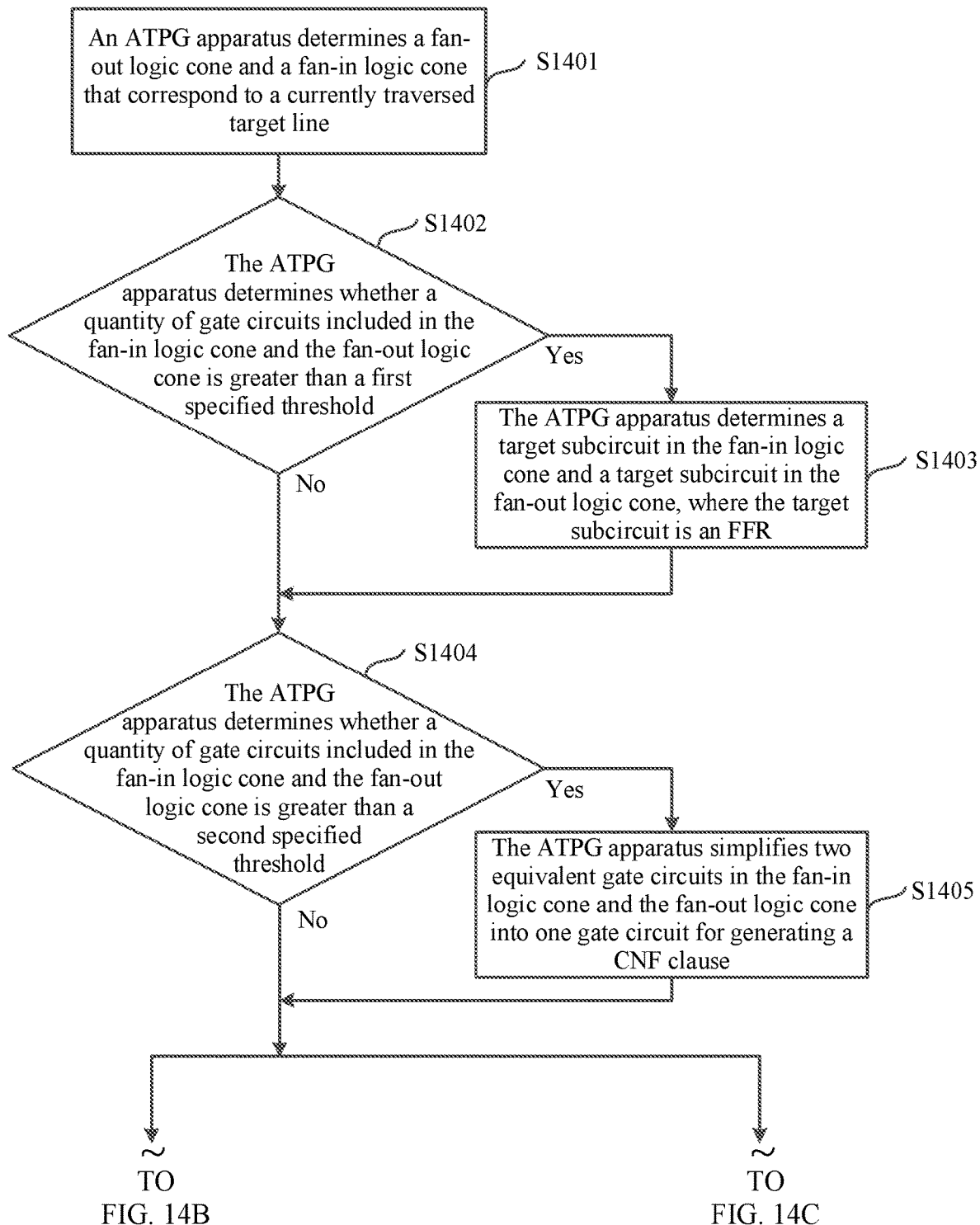
FIG. 14A, FIG. 14B, and FIG. 14C are flowcharts of an automatic test pattern generation-based circuit verification method according to an embodiment of this disclosure.
Figure 14B:
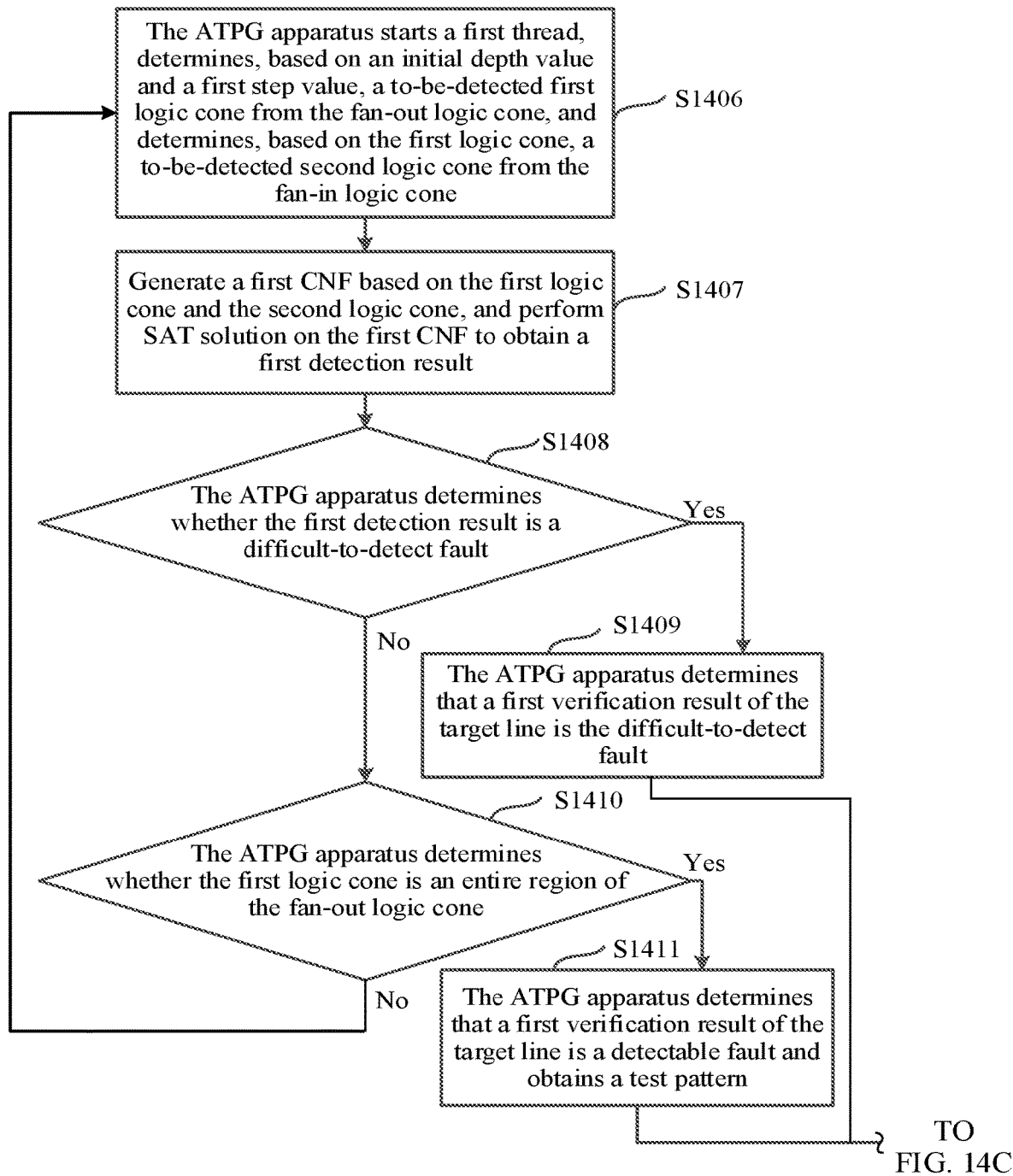
Figure 14C:
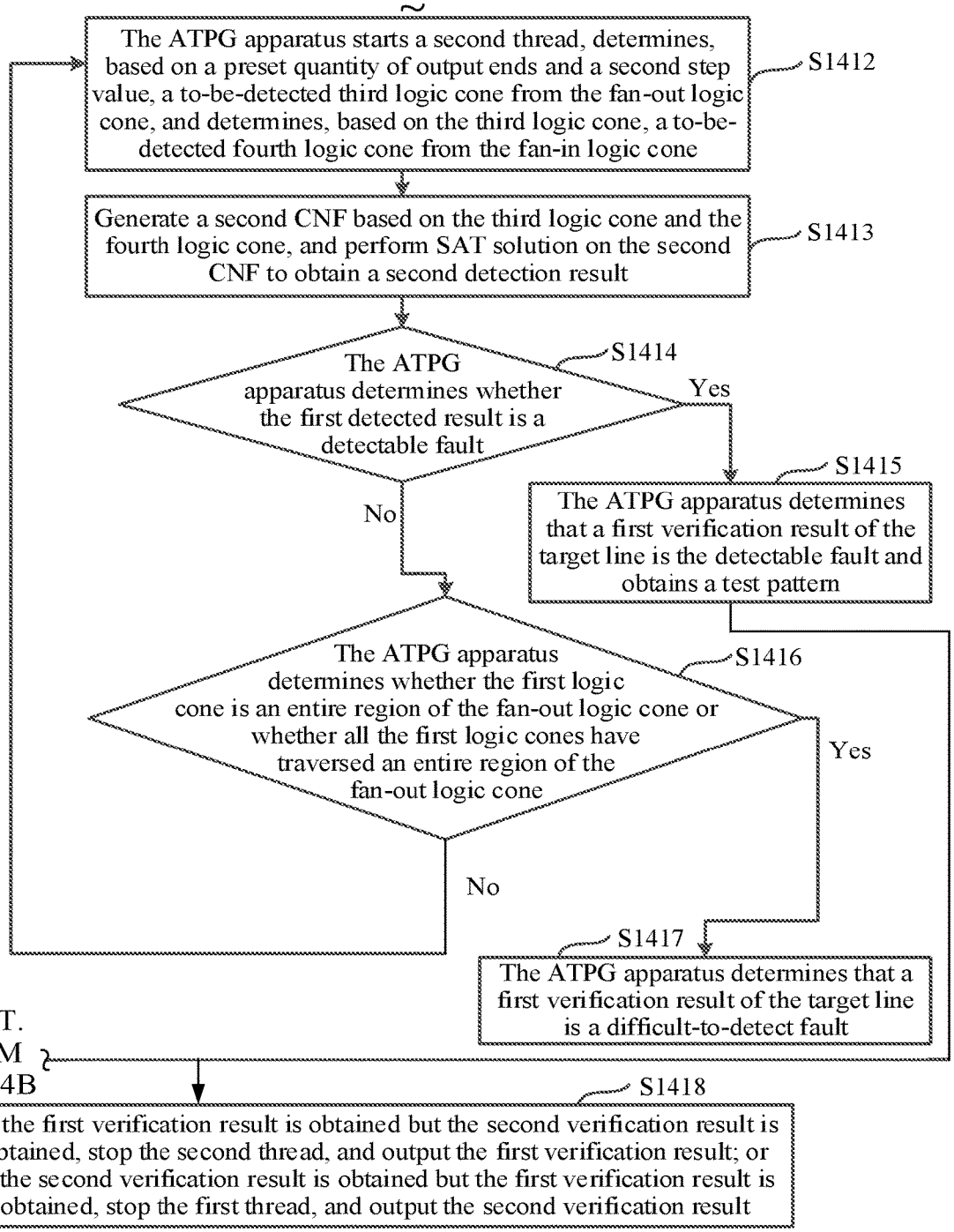

The following further describes an ATPG-based circuit verification method provided in an embodiment of this application by using a specific instance. FIG. 14A, FIG. 14B, and FIG. 14C are flowcharts of an ATPG-based circuit verification method according to an embodiment of this application. The method includes the following steps.

S1401: The ATPG apparatus determines a fan-out logic cone and a fan-in logic cone that correspond to a currently traversed target line.

S1402: The ATPG apparatus determines whether a quantity of gate circuits included in the fan-in logic cone and the fan-out logic cone is greater than a first specified threshold. If the quantity of gate circuits included in the fan-in logic cone and the fan-out logic cone is greater than the first specified threshold, S1403 is performed; or if the quantity of gate circuits included in the fan-in logic cone and the fan-out logic cone is not greater than the first specified threshold, S1404 is performed.

S1403: The ATPG apparatus determines a target sub-circuit in the fan-in logic cone and a target sub-circuit in the fan-out logic cone, where the target sub-circuit is an FFR.

S1404: The ATPG apparatus determines whether the quantity of gate circuits included in the fan-in logic cone and the fan-out logic cone is greater than a second specified threshold. If the quantity of gate circuits included in the fan-in logic cone and the fan-out logic cone is greater than the second specified threshold, S1405 is performed; or if the quantity of gate circuits included in the fan-in logic cone and the fan-out logic cone is not greater than the second specified threshold, S1406 and S1412 are performed.

S1405: The ATPG apparatus simplifies two equivalent gate circuits in the fan-in logic cone and the fan-out logic cone into one gate circuit for generating a CNF clause.

S1406: The ATPG apparatus starts a first thread, determines, based on an initial depth value and a first step value, a to-be-detected first logic cone from the fan-out logic cone, and determines, based on the first logic cone, a to-be-detected second logic cone from the fan-in logic cone.

S1407: The ATPG apparatus generates a first CNF based on the first logic cone and the second logic cone, and performs SAT solution on the first CNF to obtain a first detection result.

S1408: The ATPG apparatus determines whether a fault type in the first detection result is a difficult-to-detect fault. If the fault type in the first detection result is a difficult-to-detect fault, S1409 is performed; or if the fault type in the first detection result is not a difficult-to-detect fault, S1410 is performed.

S1409: The ATPG apparatus determines, based on the first detection result, that a first verification result is that the fault type of the target line is the difficult-to-detect fault.

S1410: The ATPG apparatus determines whether the first logic cone is an entire region of the fan-out logic cone. If the first logic cone is the entire region of the fan-out logic cone, S1411 is performed; or if the first logic cone is not the entire region of the fan-out logic cone, S1412 is performed.

S1411: The ATPG apparatus determines that the first verification result is that the fault type of the target line is a detectable fault, and generates a test pattern.

S1412: The ATPG apparatus starts a second thread, determines, based on a preset quantity of output ends and a second step value, a to-be-detected third logic cone from the fan-out logic cone, and determines, based on the third logic cone, a to-be-detected fourth logic cone from the fan-in logic cone.

S1413: The ATPG apparatus generates a second CNF based on the third logic cone and the fourth logic cone, and performs SAT solution on the second CNF to obtain a second detection result.

S1414: The ATPG apparatus determines whether a fault type in the second detection result is a detectable fault. If the fault type in the second detection result is a detectable fault, S1415 is performed; or if the fault type in the second detection result is not a detectable fault, S1416 is performed.

S1415: The ATPG apparatus determines, based on the second detection result, that a second verification result is that the fault type of the target line is a detectable fault, and obtains a test pattern.

S1416: The ATPG apparatus determines whether the third logic cone is an entire region of the fan-out logic cone or whether all the third logic cones have traversed an entire region of the fan-out logic cone. If the third logic cone is the entire region of the fan-out logic cone or all the third logic cones have traversed the entire region of the fan-out logic cone, S1417 is performed; or if the third logic cone is not the entire region of the fan-out logic cone or not all the third logic cones have traversed the entire region of the fan-out logic cone, S1418 is performed.

S1417: The ATPG apparatus determines that the second verification result is that the fault type of the target line is a difficult-to-detect fault.

S1418: When determining that the first verification result is obtained but the second verification result is not obtained, the ATPG apparatus stops the second thread, and outputs the first verification result. Alternatively, when determining that the second verification result is obtained but the first verification result is not obtained, the ATPG apparatus stops the first thread, and outputs the second verification result.

The following further describes effects brought by the ATPG-based circuit verification method provided in embodiments of this application with reference to a result of testing performed on a hard case of a plurality of combined circuits by using the ATPG-based circuit verification method provided in embodiments of this application.

First, several hard cases of the circuit under test in embodiments of this disclosure are described. Table 1 shows four circuits with different integration scales.

TABLE 1

| Name of a circuit under test | Maximum logic cone depth (max-depth) | Quantity of gate circuits |
|---|---|---|
| b17 | 52 | 45339 |
| b19 | 126 | 261358 |
| b17-3 | 145 | 123360 |
| b17-5 | 234 | 203664 |

The circuit under test b17-5 has reached the logic cone depth of industrial large-scale circuits.

The first set of test results are difficult-to-detect faults for the four circuits shown in Table 1 above (that is, redundant faults in actual industrial circuit detection and aborted faults that cannot be solved at a specified time. The faults are referred to as hard cases. From a perspective of optimization, the worst case of the hard cases requires full traversal of the search space. The faults are hard case faults for a heuristic detection method), as shown in Table 2.

TABLE 2

| Name of a circuit under test | Detection time of the method provided in this application (s) | Current SAT algorithm Detection time (s) | Increased rate |
|---|---|---|---|
| b17 | 2.43 | 4.08 | 40.44% |
| b19 | 14.21 | 30.93 | 54.05% |
| b17-3 | 181.02 | 388.15 | 53.36% |
| b17-5 | 1481 | 5311.65 | 72.11% |

The second set of tests is test results obtained after the circuit under test b17-3 is detected according to the ATPG-based circuit verification method and the current ATPG-based circuit verification method provided in embodiments of this disclosure. The ATPG-based circuit verification method provided in this embodiment of this disclosure includes performing circuit simplification processing. The second set of test results is shown in Table 3.

TABLE 3

| Name of a circuit under test | ATPG-based circuit verification method provided in an embodiment of this application | | Current ATPG-based circuit verification method | | Increased coverage rate |
|---|---|---|---|---|---|
| | Test time (s) | Coverage rate | Test time (s) | Coverage rate | |
| b17-3 | 47.6 | 100% | 19.3 | 0% | 0.67% |
| | 30.2 | 90% | 19.3 | 0% | 0.59% |
| | 22.4 | 80% | 19.3 | 0% | 0.53% |
| | 16.8 | 70% | 19.3 | 0% | 0.47% |

The third set of tests is test results obtained after the circuit under test b17-5 is detected according to the ATPG-based circuit verification method and the current ATPG-based circuit verification method provided in embodiments of this disclosure. The ATPG-based circuit verification method provided in this embodiment of this disclosure includes performing circuit simplification processing. The third set of test results is shown in Table 4.

TABLE 4

| Name of a circuit under test | ATPG-based circuit verification method provided in an embodiment of this application | | Current ATPG-based circuit verification method | | Increased coverage rate |
|---|---|---|---|---|---|
| | Test time (s) | Coverage rate | Test time (s) | Coverage rate | |
| b17-5 | 298.5 | 100% | 100.5 | 0% | 1.297% |
| | 224.4 | 90% | 100.5 | 0% | 1.167% |
| | 115.6 | 80% | 100.5 | 0% | 1.037% |
| | 87.9 | 70% | 100.5 | 0% | 0.90% | drawn.
1. According to comparison of different scales, compared with an original ATPG-based detection method according to an SAT algorithm, the ATPG-based circuit verification method provided in this embodiment of this application has more prominent advantages with a larger circuit.
2. The coverage rate in the ATPG-based circuit verification method provided in this embodiment of this application may exceed the coverage rate in the current ATPG-based circuit verification method within a specific time limit. A specific analysis is as follows.
(1) For the circuit under test b17-3 with a medium depth, according to the ATPG-based circuit verification method provided in this embodiment of this disclosure, more than 90% of faults that cannot be detected by using the current ATPG-based circuit verification method can be verified within twice a time of the current ATPG-based circuit verification method, increasing the coverage rate by 0.59%. In addition, according to the ATPG-based circuit verification method provided in this embodiment of this disclosure, 70% of faults that cannot be detected by using the current ATPG-based circuit verification method can be verified at a time shorter than that of the current ATPG-based circuit verification method, increasing the coverage rate by 0.47%.
(2) For the circuit under test b17-5 with the maximum depth in the circuit under test, according to the ATPG-based circuit verification method provided in this embodiment of this disclosure, nearly 90% faults that cannot be detected by using the current ATPG-based circuit verification method can be verified within twice a time of the current ATPG-based circuit verification method, increasing the coverage rate by over 0.77%. In addition, according to the ATPG-based circuit verification method provided in this embodiment of this disclosure, about 70% of faults that cannot be detected by using the current ATPG-based circuit verification method can be verified within the same test time as the current ATPG-based circuit verification method, increasing the coverage rate by 0.9%.

In addition, when the first CNF is solved by using the sequence decision method of looking ahead calculation provided in this embodiment of this disclosure, a test result of the large-scale circuit verification is shown in Table 5.

TABLE 5

| Name of a circuit under test | Test time for direct SAT solution (s) | Test time for sampling a clause from the first CNF for SAT (s) | Increased rate | Test time for sampling a plurality of clauses from the first CNF for SAT (s) | Increased rate |
|---|---|---|---|---|---|
| P2_SUB_414_U113 | 6.53 | 3.24 | 50.38% | 3.56 (twice) | 45.48% |
| P2_SUB_414_U114 | 7.39 | 4.13 | 44.11% | 4.02 (twice) | 45.60% |
| P2_SUB_355_U47 | 7.87 | 5.21 | 33.79% | 4.23 (twice) | 46.25% |
| dated-5-19-u | 4427 | 2532 | 42.81% | 2218 (10 times) | 49.90% |
| Ndhf_xits_09_UNS | 14400 | 8243 | 42.75% | 7634 (10 times) | 46.99% |

It can be learned from Table 5 that, when SAT solution is performed on the first CNF, an average increase of 42.77% is obtained in a clause sampled once, and an average increase of 46.84% is obtained in a clause sampled a plurality of times. The sequence decision method of looking ahead calculation provided in this embodiment of this disclosure significantly improves efficiency of SAT solution on the CNF.

For a test result of the circuit simplification method provided in this embodiment of this disclosure in the circuit verification problem, refer to Table 6.

TABLE 6

| Name of a circuit under test | Test time with no simplification processing (s) | Test time after simplification (s) | Increased rate |
| --- | --- | --- | --- |
| P2_SUB_414_U113 | 0.21 | 0.147 | 30% |
| P2_SUB_414_U114 | 0.40 | 0.29 | 27.5% |
| P1_SUB_414_U64 | 5.97 | 4.29 | 28.14% |
| P1_ADD_430_U83_2 | 1.96 | 1.44 | 26.53% |

It can be learned from Table 6 that after a simplification module is added, the performance of the ATPG-based method is improved by 28.04% on average.

Figure 15:
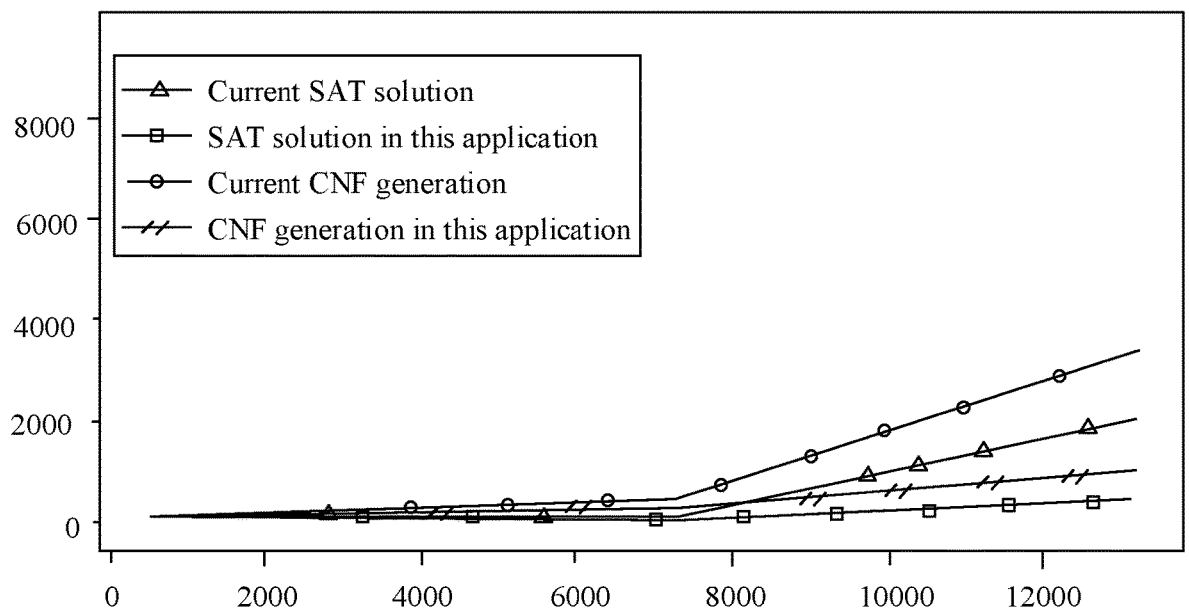
FIG. 15 is a diagram of a comparison result of an automatic test pattern generation-based circuit verification method and a current automatic test pattern generation-based circuit verification method according to an embodiment of this disclosure.

Finally, the ATPG-based circuit verification method provided in this embodiment of this disclosure is compared with the current ATPG-based circuit verification method. As shown in FIG. 15, the ATPG-based circuit verification method provided in this embodiment of this disclosure has better performance than the current ATPG-based circuit verification method in an increased rate and a total increased time in terms of generating the CNF and performing SAT solution on the CNF.

In conclusion, according to the ATPG-based circuit verification method provided in this embodiment of this disclosure, a symbol calculation feature of the SAT is fully utilized, and a detection procedure is divided into core modules such as circuit decomposition, circuit simplification, incremental calculation, and online prediction (Looking ahead). It effectively avoids a bottleneck of SAT calculation in ATPG, for example, a time for generating the CNF is too long or even longer than the solution time, and hidden structure information of the circuit is difficult to be included in the CNF. The ATPG-based circuit verification method provided in this embodiment of this disclosure may be directly used for detection of hard cases, to effectively increase the coverage rate.

Figure 16:
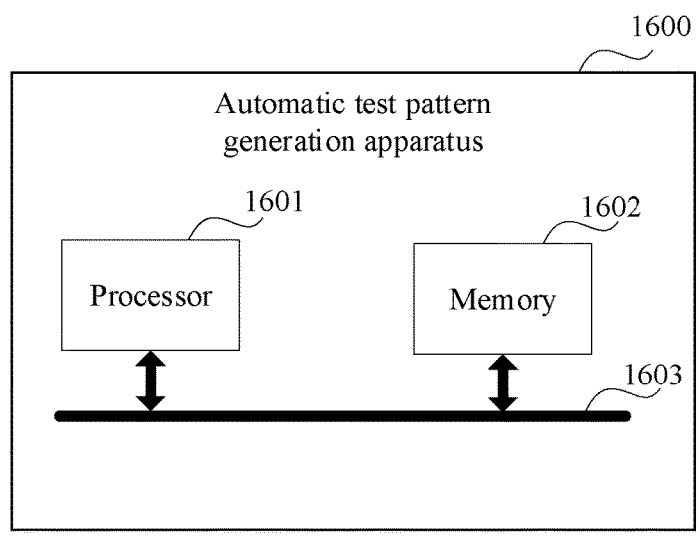
FIG. 16 is a schematic structural diagram of an automatic test pattern generation apparatus according to an embodiment of this disclosure.

An embodiment of this application further provides an automatic test pattern generation apparatus 1600. FIG. 16 is a schematic diagram of a structure of an automatic test pattern generation apparatus according to an embodiment of this disclosure. Refer to FIG. 16. The automatic test pattern generation apparatus 1600 includes a processor 1601, a memory 1602, and a bus 1603. The processor 1601 and the memory 1602 communicate with each other through the bus 1603, or may communicate with each other in another manner such as wireless transmission. The memory 1602 is configured to store instructions, and the processor 1601 is configured to execute the instructions stored in the memory 1602. The memory 1602 stores program code, and the processor 1601 may invoke the program code stored in the memory 1602 to perform the following operations: perform the following procedures on a target line in a circuit under test, where the circuit under test includes a plurality of lines, any line is a connection line between two connected gate circuits, and the target line is any line in the plurality of lines; determine a to-be-detected first logic cone from a fan-out logic cone corresponding to a target line, where the fan-out logic cone is a region formed by a gate circuit that passes from the target line to an output end of the circuit under test; determine, based on the first logic cone, a to-be-detected second logic cone from a fan-in logic cone corresponding to the target line, where the fan-in logic cone is a region formed by a gate circuit that passes from an input end of the circuit under test to the target line, and the second logic cone is a region that is in the fan-in logic cone and that is formed by a gate circuit that affects an output value of the first logic cone; and generate a first conjunctive normal form CNF based on the first logic cone and the second logic cone.

The processor 1601 is configured to detect the target line by using the first CNF to obtain a first detection result, where the first detection result indicates a fault type of the target line; and if the first logic cone is a partial region in the fan-out logic cone, and the first detection result meets a first specified condition corresponding to the first logic cone, determine a first verification result of the target line based on the first detection result.

In an implementation, the processor 1601 is further configured to if the first logic cone is an entire region of the fan-out logic cone, determine the first verification result based on the first detection result.

In an implementation, the processor 1601 is further configured to if the first logic cone is the partial region in the fan-out logic cone, and the first detection result does not meet the first specified condition, determine a to-be-detected first logic cone again from the fan-out logic cone, where first logic cones determined different times are not all the same.

In an implementation, the processor 1601 is specifically configured to determine, based on a preset initial depth value and a first step value, the first logic cone from the fan-out logic cone, where the initial depth value represents a distance between the target line and the gate circuit.

In an implementation, the first specified condition is that the fault type in the first detection result is a difficult-to-detect fault.

In an implementation, the processor 1601 is specifically configured to determine, based on a preset quantity of output ends and a second step value, the first logic cone from the fan-out logic cone.

In an implementation, the first detection result includes the fault type and a test pattern, and the test pattern is used to perform circuit fault detection on the circuit under test; and the first specified condition is that the fault type in the first detection result is a detectable fault.

In an implementation, the processor 1601 is further configured to determine a to-be-detected third logic cone from the fan-out logic cone; and determine a to-be-detected fourth logic cone from the fan-in logic cone, where the third logic cone is different from the first logic cone, and the fourth logic cone is a region that is in the fan-in logic cone and that is formed by a gate circuit that affects an output value of the third logic cone; and generate a second CNF based on the third logic cone and the fourth logic cone.

The processor 1601 is further configured to detect the target line by using the second CNF to obtain a second detection result, where the second detection result indicates a fault type of the target line; when the first verification result is not determined, if the third logic cone is a partial region in the fan-out logic cone, and the second detection result meets a second specified condition corresponding to the third logic cone, determine a second verification result corresponding to the target line based on the second detection result, and stop detecting the target line by using the first CNF; and when the first verification result is determined, stop detecting the target line by using the second CNF.

In an implementation, the first CNF includes at least one clause, and the at least one clause is generated based on a gate circuit in the first logic cone and a gate circuit in the second logic cone.

In an implementation, the processor 1601 is specifically configured to if a quantity of clauses included in the first CNF is greater than or equal to a specified threshold, separately perform satisfiability SAT solution on the at least one clause, and determine an SAT solution result of each clause; and use an intersection of SAT solution results of the at least one clause as the first detection result.

In an implementation, the first CNF includes at least one target clause corresponding to at least one target sub-circuit in the first logic cone and at least one target clause corresponding to at least one target sub-circuit in the second logic cone, where the target sub-circuit is in a one-to-one correspondence with the target clause, and any target sub-circuit includes at least one gate circuit.

In an implementation, the processor 1601 is further configured to before the generation unit determines the to-be-detected first logic cone from the fan-out logic cone corresponding to the target line, if a quantity of gate circuits included in the fan-in logic cone and the fan-out logic cone is greater than a first specified threshold, determine a target sub-circuit in the fan-in logic cone based on the gate circuit in the fan-in logic cone, and determine a target sub-circuit in the fan-out logic cone based on the gate circuit in the fan-out logic cone.

In an implementation, the target sub-circuit is a fan-out free region FFR.

In an implementation, the processor 1601 is further configured to before the generation unit determines the to-be-detected first logic cone from the fan-out logic cone corresponding to the target line, if a quantity of gate circuits included in the fan-in logic cone and the fan-out logic cone is greater than a second specified threshold, simplify two equivalent gate circuits in the fan-in logic cone and the fan-out logic cone into one gate circuit for generating a CNF clause, where the second specified threshold is less than the first specified threshold, and the two equivalent gate circuits are two gate circuits with the same input and the same output.

It may be understood that the memory 1602 in FIG. 16 in this disclosure may be a volatile memory or a non-volatile memory, or may include a volatile memory and a non-volatile memory. The non-volatile memory may be a read-only memory (ROM), a programmable read-only memory (PROM), an erasable programmable read-only memory (EPROM), an electrically erasable programmable read-only memory (EEPROM), or a flash memory. The volatile memory may be a random-access memory (RAM), used as an external cache. Through example but not limitative description, many forms of RAMs may be used, for example, a static random-access memory (SRAM), a dynamic random-access memory (DRAM), a synchronous dynamic random-access memory (SDRAM), a double data rate synchronous dynamic random-access memory (DDR SDRAM), an enhanced synchronous dynamic random-access memory (ESDRAM), a synchronous link dynamic random-access memory (SLDRAM), and a direct Rambus random-access memory (DR RAM). It should be noted that the memory in the systems and methods described in this specification includes but is not limited to these and any memory of another appropriate type.

Figure 17:
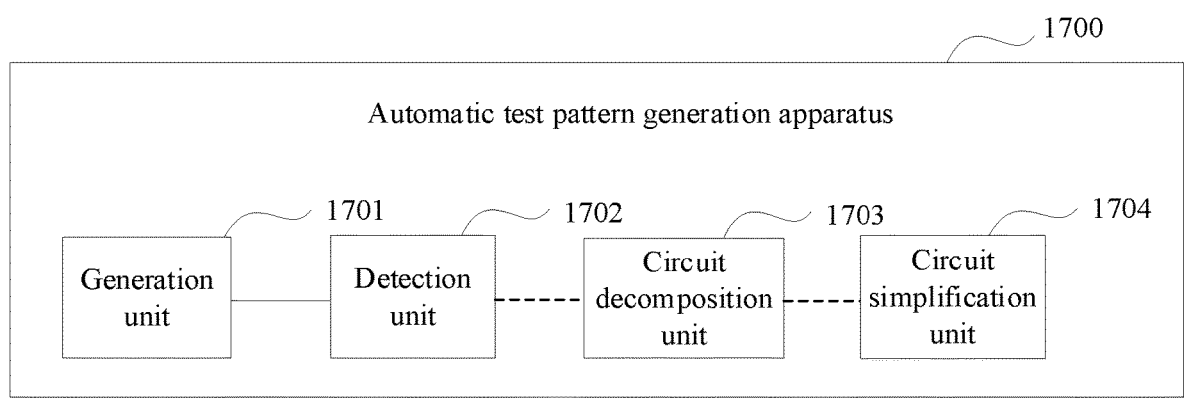
FIG. 17 is a schematic structural diagram of another automatic test pattern generation apparatus according to an embodiment of this disclosure.

An embodiment of this disclosure further provides an automatic test pattern generation apparatus 1700. FIG. 17 is a schematic diagram of a structure of the automatic test pattern generation apparatus. The automatic test pattern generation apparatus 1700 includes a generation unit 1701 and a detection unit 1702. Optionally, a circuit decomposition unit 1703 and a circuit simplification unit 1704 may be further included. Functions of each unit in the automatic test pattern generation apparatus 1700 are described below.

The generation unit 1701 is configured to perform the following procedures on a target line in a circuit under test, where the circuit under test includes a plurality of lines, any line is a connection line between two connected gate circuits, and the target line is any line in the plurality of lines; determine a to-be-detected first logic cone from a fan-out logic cone corresponding to a target line, where the fan-out logic cone is a region formed by a gate circuit that passes from the target line to an output end of the circuit under test; determine, based on the first logic cone, a to-be-detected second logic cone from a fan-in logic cone corresponding to the target line, where the fan-in logic cone is a region formed by a gate circuit that passes from an input end of the circuit under test to the target line, and the second logic cone is a region that is in the fan-in logic cone and that is formed by a gate circuit that affects an output value of the first logic cone; and generate a first conjunctive normal form CNF based on the first logic cone and the second logic cone.

The detection unit 1702 is configured to detect the target line by using the first CNF to obtain a first detection result, where the first detection result indicates a fault type of the target line; and if the first logic cone is a partial region in the fan-out logic cone, and the first detection result meets a first specified condition corresponding to the first logic cone, determine a first verification result of the target line based on the first detection result.

In an implementation, the detection unit 1702 is further configured to if the first logic cone is an entire region of the fan-out logic cone, determine the first verification result based on the first detection result.

In an implementation, the generation unit 1701 is further configured to if the first logic cone is the partial region in the fan-out logic cone, and the first detection result does not meet the first specified condition, determine a to-be-detected first logic cone again from the fan-out logic cone, where first logic cones determined different times are not all the same.

In an implementation, the generation unit 1701 is specifically configured to determine, based on a preset initial depth value and a first step value, the first logic cone from the fan-out logic cone, where the initial depth value represents a distance between the target line and the gate circuit.

In an implementation, the first specified condition is that the fault type in the first detection result is a difficult-to-detect fault.

In an implementation, the generation unit 1701 is specifically configured to determine, based on a preset quantity of output ends and a second step value, the first logic cone from the fan-out logic cone.

In an implementation, the first detection result includes the fault type and a test pattern, and the test pattern is used to perform circuit fault detection on the circuit under test; and the first specified condition is that the fault type in the first detection result is a detectable fault.

In an implementation, the generation unit 1701 is further configured to determine a to-be-detected third logic cone from the fan-out logic cone; and determine a to-be-detected fourth logic cone from the fan-in logic cone, where the third logic cone is different from the first logic cone, and the fourth logic cone is a region that is in the fan-in logic cone and that is formed by a gate circuit that affects an output value of the third logic cone; and generate a second CNF based on the third logic cone and the fourth logic cone.

The detection unit 1702 is further configured to detect the target line by using the second CNF to obtain a second detection result, where the second detection result indicates a fault type of the target line; when the first verification result is not determined, if the third logic cone is a partial region in the fan-out logic cone, and the second detection result meets a second specified condition corresponding to the third logic cone, determine a second verification result corresponding to the target line based on the second detection result, and stop detecting the target line by using the first CNF; and when the first verification result is determined, stop detecting the target line by using the second CNF.

In an implementation, the first CNF includes at least one clause, and the at least one clause is generated based on a gate circuit in the first logic cone and a gate circuit in the second logic cone.

In an implementation, the detection unit 1702 is specifically configured to if a quantity of clauses included in the first CNF is greater than or equal to a specified threshold, separately perform satisfiability SAT solution on the at least one clause, and determine an SAT solution result of each clause; and use an intersection of SAT solution results of the at least one clause as the first detection result.

In an implementation, the first CNF includes at least one target clause corresponding to at least one target sub-circuit in the first logic cone and at least one target clause corresponding to at least one target sub-circuit in the second logic cone, where the target sub-circuit is in a one-to-one correspondence with the target clause, and any target sub-circuit includes at least one gate circuit.

In an implementation, the automatic test pattern generation apparatus further includes a circuit decomposition unit 1703. The circuit decomposition unit 1703 is configured to before the generation unit determines the to-be-detected first logic cone from the fan-out logic cone corresponding to the target line, if a quantity of gate circuits included in the fan-in logic cone and the fan-out logic cone is greater than a first specified threshold, determine a target sub-circuit in the fan-in logic cone based on the gate circuit in the fan-in logic cone, and determine a target sub-circuit in the fan-out logic cone based on the gate circuit in the fan-out logic cone.

In an implementation, the target sub-circuit is a FFR.

In an implementation, the automatic test pattern generation apparatus further includes a circuit simplification unit 1704. The circuit simplification unit 1704 is configured to before the generation unit determines the to-be-detected first logic cone from the fan-out logic cone corresponding to the target line, if a quantity of gate circuits included in the fan-in logic cone and the fan-out logic cone is greater than a second specified threshold, simplify two equivalent gate circuits in the fan-in logic cone and the fan-out logic cone into one gate circuit for generating a CNF clause, where the second specified threshold is less than the first specified threshold, and the two equivalent gate circuits are two gate circuits with the same input and the same output.

It should be noted that, in embodiments of this disclosure, unit division is an example, and is merely logical function division. During actual implementation, another division manner may be used. Functional units in embodiments of this disclosure may be integrated into one processing unit, or each of the units may exist alone physically, or two or more units may be integrated into one unit. The integrated unit may be implemented in a form of hardware, or may be implemented in a form of a software functional unit.

Based on the foregoing embodiments, an embodiment of this disclosure further provides a chip. The chip is connected to a memory, and the chip is configured to read and execute a software program stored in the memory, to implement the ATPG-based circuit verification method provided in the embodiment shown in FIG. 7 or FIG. 14A, FIG. 14B, and FIG. 14C.

Based on the foregoing embodiments, an embodiment of this disclosure provides a chip system. The chip system includes a processor, configured to support a computer apparatus in implementing the ATPG-based circuit verification method provided in the embodiment shown in FIG. 7 or FIG. 14A, FIG. 14B, and FIG. 14C. In a possible design, the chip system further includes a memory. The memory is configured to store a program and data that are necessary for the computer apparatus. The chip system may include a chip, or may include a chip and another discrete component.

Based on the foregoing embodiments, an embodiment of this disclosure further provides a computer program. When the computer program runs on a computer, the computer is enabled to perform the ATPG-based circuit verification method provided in the foregoing embodiments.

Based on the foregoing embodiments, an embodiment of this disclosure further provides a computer-readable storage medium. The computer-readable storage medium stores a computer program. When the computer program is executed by a computer, the computer is enabled to perform the ATPG-based circuit verification method provided in the foregoing embodiments.

A person skilled in the art should understand that embodiments of this disclosure may be provided as a method, a system, or a computer program product. Therefore, this application may use a form of a hardware-only embodiment, a software-only embodiment, or an embodiment with a combination of software and hardware. In addition, this disclosure may use a form of a computer program product that is implemented on one or more computer-usable storage media (including but not limited to a disk memory, a CD-ROM, an optical memory, and the like) that include computer-usable program code.

This disclosure is described with reference to the flowcharts and/or block diagrams of the method, the device (system), and the computer program product according to this disclosure. It should be understood that computer program instructions may be used to implement each process and/or each block in the flowcharts and/or the block diagrams and a combination of a process and/or a block in the flowcharts and/or the block diagrams. The computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more procedures in the flowcharts and/or in one or more blocks in the block diagrams.

The computer program instructions may alternatively be stored in a computer-readable memory that can indicate a computer or another programmable data processing device to work in a specific manner, so that the instructions stored in the computer-readable memory generate an artifact that includes an instruction apparatus. The instruction apparatus implements a specific function in one or more procedures in the flowcharts and/or in one or more blocks in the block diagrams.

The computer program instructions may alternatively be loaded onto a computer or another programmable data processing device, so that a series of operations and steps are performed on the computer or the another programmable device, so that computer-implemented processing is generated. Therefore, the instructions executed on the computer or the another programmable device provide steps for implementing a specific function in one or more procedures in the flowcharts and/or in one or more blocks in the block diagrams.

It is clear that a person skilled in the art can make various modifications and variations to this disclosure without departing from the scope of this disclosure. This disclosure is intended to cover these modifications and variations of this disclosure provided that they fall within the scope of protection defined by the following claims and their equivalent technologies.

What is claimed is:

1. A method comprising:
    selecting, a first logic cone from a fan-out logic cone corresponding to a target line in a circuit to be tested, wherein the fan-out logic cone comprises a first gate circuit that extends from the target line to an output end of the circuit;
    identifying, based on the first logic cone, a second logic cone in a fan-in logic cone corresponding to the target line, wherein the fan-in logic cone comprises a second gate circuit that extends from an input end of the circuit to the target line, and wherein the second logic cone comprises a third gate circuit that affects a first output value of the first logic cone;
    generating a first conjunctive normal form (CNF) based on the first logic cone and the second logic cone;
    detecting the target line using the first CNF to obtain a first detection result, wherein the first detection result indicates a fault type of the target line; and
    obtaining, when the first logic cone is a partial region in the fan-out logic cone and the first detection result meets a first specified condition corresponding to the first logic cone, a first verification result of the target line based on the first detection result.

2. The method according to claim 1, wherein the method further comprises further obtaining the first verification result based on the first detection result when the first logic cone is an entire region of the fan-out logic cone.

3. The method according to claim 1, wherein the method further comprises identifying, when the first logic cone is the partial region in the fan-out logic cone and the first detection result does not meet the first specified condition, a third logic cone from the fan-out logic cone, and wherein the third logic cone and the first logic cone are different.

4. The method according to claim 1, wherein selecting the first logic cone comprises selecting the first logic cone based on a preset initial depth value and a first step value, and wherein the initial depth value represents a distance between the target line and the first gate circuit.

5. The method according to claim 4, wherein the first specified condition is that the fault type in the first detection result is a difficult-to-detect fault.

6. The method according to claim 1, wherein selecting the first logic cone comprises selecting the first logic cone based on a preset quantity of output ends and a first step value.

7. The method according to claim 6, wherein the first detection result comprises:
    the fault type and a test pattern, wherein the test pattern is for performing circuit fault detection on the circuit; and
    the first specified condition is that the fault type in the first detection result is a detectable fault.

8. The method according to claim 1, wherein the method further comprises:
    selecting a third logic cone from the fan-out logic cone;
    selecting a fourth logic cone from the fan-in logic cone, wherein the third logic cone is different from the first logic cone, and wherein the fourth logic cone is in the fan-in logic cone and comprises a fourth gate circuit that affects a second output value of the third logic cone;
    generating a second CNF based on the third logic cone and the fourth logic cone, and
    detecting the target line using the second CNF to obtain a second detection result, wherein the second detection result indicates the fault type of the target line;
    when the first verification result is not obtained, the third logic cone is a partial region in the fan-out logic cone, and the second detection result meets a second specified condition corresponding to the third logic cone:
        obtaining a second verification result corresponding to the target line based on the second detection result; and
        stopping detecting the target line by using the first CNF; and
    stopping, when the first verification result is obtained, detecting the target line by using the second CNF.

9. The method according to claim 1, wherein the first CNF comprises at least one clause that is based on a fourth gate circuit in the first logic cone and a fifth gate circuit in the second logic cone.

10. The method according to claim 9, wherein the detecting the target line comprises:
    separately performing, when a quantity of clauses in the first CNF is greater than or equal to a specified threshold, a satisfiability (SAT) solution on the at least one clause;
    obtaining an SAT solution result of each of the at least one clause; and
    using an intersection of the SAT solution result of each of the at least one clause as the first detection result.

11. The method according to claim 9, wherein the first CNF comprises at least one target clause corresponding to at least one first target sub-circuit in the first logic cone and at least one target clause corresponding to at least one second target sub-circuit in the second logic cone, wherein the at least one first target sub-circuit is in a one-to-one correspondence with the at least one target clause, and wherein any of the at least one first target sub-circuit and the at least one second target sub-circuit comprises at least one fourth gate circuit.

12. The method according to claim 11, wherein before selecting the first logic cone, the method further comprises:
    identifying, when a quantity of gate circuits in the fan-in logic cone and the fan-out logic cone is greater than a first specified threshold, a first target sub-circuit in the fan-in logic cone based on the second gate circuit in the fan-in logic cone; and
    identifying a second target sub-circuit in the fan-out logic cone based on the first gate circuit in the fan-out logic cone.

13. The method according to claim 12, wherein the first target sub-circuit or the second target sub-circuit is a fan-out free region (FFR).

14. The method according to claim 12, wherein before selecting the first logic cone, the method further comprises simplifying, when a quantity of gate circuits in the fan-in logic cone and the fan-out logic cone is greater than a second specified threshold, two equivalent gate circuits in the fan-in logic cone and the fan-out logic cone into one fourth gate circuit for generating a CNF clause, wherein the second specified threshold is less than the first specified threshold, and wherein the two equivalent gate circuits are two fifth gate circuits with a same input and a same output.

15. An apparatus comprising:
at least one memory configured to store instructions; and
at least one processor coupled to at least one memory and configured to execute the instructions to cause the apparatus to:
select a first logic cone from a fan-out logic cone corresponding to a target line in a circuit, wherein the fan-out logic cone comprises a first gate circuit that extends from the target line to an output end of the circuit;
identify, based on the first logic cone, a second logic cone in a fan-in logic cone corresponding to the target line, wherein the fan-in logic cone comprises a second gate circuit that extends from an input end of the circuit to the target line, and wherein the second logic cone comprises a third gate circuit that affects a first output value of the first logic cone;
generate a first conjunctive normal form (CNF) based on the first logic cone and the second logic cone;
detect the target line using the first CNF to obtain a first detection result, wherein the first detection result indicates a fault type of the target line; and
obtain, when the first logic cone is a partial region in the fan-out logic cone and the first detection result meets a first specified condition corresponding to the first logic cone, a first verification result of the target line based on the first detection result.

16. The apparatus according to claim 15, wherein the at least one processor is further configured to execute the instructions to cause the apparatus to select the first logic cone based on a preset initial depth value and a first step value, wherein the initial depth value represents a distance between the target line and the first gate circuit.

17. The apparatus according to claim 15, wherein the first CNF comprises at least one clause that is based on a fourth gate circuit in the first logic cone and a fifth gate circuit in the second logic cone.

18. The apparatus according to claim 15, wherein the at least one processor is further configured to execute the instructions to cause the apparatus to further obtain the first verification result based on the first detection result when the first logic cone is an entire region of the fan-out logic cone.

19. The apparatus according to claim 15, wherein the at least one processor is further configured to execute the instructions to cause the apparatus to identify, when the first logic cone is the partial region in the fan-out logic cone and the first detection result does not meet the first specified condition, a third logic cone from the fan-out logic cone, wherein the third logic cone and the first logic cone are different.

20. A computer program product comprising computer-executable instructions stored on a non-transitory computer readable medium that, when executed by at least one processor, cause an apparatus to:
select a first logic cone from a fan-out logic cone corresponding to a target line in a circuit, wherein the fan-out logic cone comprises a first gate circuit that extends from the target line to an output end of the circuit;
identify, based on the first logic cone, a second logic cone in a fan-in logic cone corresponding to the target line, wherein the fan-in logic cone comprises a second gate circuit that extends from an input end of the circuit to the target line, and wherein the second logic cone comprises a third gate circuit that affects a first output value of the first logic cone;
generate a first conjunctive normal form (CNF) based on the first logic cone and the second logic cone;
detect the target line using the first CNF to obtain a first detection result, wherein the first detection result indicates a fault type of the target line; and
obtain, when the first logic cone is a partial region in the fan-out logic cone and the first detection result meets a first specified condition corresponding to the first logic cone, a first verification result of the target line based on the first detection result.

* * * * *